(12) United States Patent
Kim et al.

(10) Patent No.: US 11,169,649 B2
(45) Date of Patent: Nov. 9, 2021

(54) TOUCH PANEL, ELECTRONIC DEVICE INCLUDING SAME, AND METHOD FOR MANUFACTURING TOUCH PANEL

(71) Applicant: Samsung Display Co., Ltd., Yongin-si (KR)

(72) Inventors: Kyungseop Kim, Hwaseong-si (KR); Hanyung Jung, Hwaseong-si (KR); Sangyoun Han, Seoul (KR); Yongwoo Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/940,200

(22) Filed: Jul. 27, 2020

(65) Prior Publication Data

US 2020/0358437 A1 Nov. 12, 2020

Related U.S. Application Data

(62) Division of application No. 15/367,730, filed on Dec. 2, 2016, now Pat. No. 10,763,857.

(30) Foreign Application Priority Data

Jun. 1, 2016 (KR) .......................... 10-2016-0068366

(51) Int. Cl.
*H03K 17/96* (2006.01)
*H05K 3/00* (2006.01)
(Continued)

(52) U.S. Cl.
CPC ............ *G06F 3/0446* (2019.05); *G06F 3/044* (2013.01); *G06F 3/0416* (2013.01);
(Continued)

(58) Field of Classification Search
CPC ...... G06F 3/0446; G06F 3/0416; G06F 3/044; G06F 3/0445; G06F 2203/04102;
(Continued)

(56) References Cited

U.S. PATENT DOCUMENTS 8,018,568 B2 * 9/2011 Allemand ........... H01L 51/0021
349/187
8,629,842 B2 1/2014 Jang
(Continued)

FOREIGN PATENT DOCUMENTS

CN 101626017 1/2010
CN 103872061 6/2014
(Continued)

OTHER PUBLICATIONS

Jacoby et al., "Predicted and measured EMI shielding effectiveness of a metallic mesh coating on a sapphire window over a broad frequency range", Window and Dome Technologies and Materials XI, vol. 7302, p. 7302OX, 2009, Society of Photo-Optical Instrumentation Engineers.
(Continued)

*Primary Examiner* — Amy Onyekaba
(74) *Attorney, Agent, or Firm* — H.C. Park & Associates, PLC

(57) ABSTRACT

A touch panel is manufactured by a method that decreases undesirable reflections of external light while improving the visibility of emitted light. The touch panel includes a base layer including an active region responsive to an external touch to generate an electronic signal and a peripheral region adjacent to the active region, and a first conductive pattern disposed on the active region and a second conductive pattern disposed on the peripheral region, each of the first conductive pattern and the second conductive pattern including a conductive layer having an external light reflectivity
(Continued)

and a darkening layer disposed over the conductive layer. External light reflectivity of each of the first and second conductive patterns is lower than that of the conductive layer.

5 Claims, 15 Drawing Sheets

(51) Int. Cl.
  *G06F 3/044* (2006.01)
  *G06F 3/041* (2006.01)
(52) U.S. Cl.
  CPC ......... *G06F 3/0445* (2019.05); *H03K 17/962* (2013.01); *H05K 3/00* (2013.01); *H05K 3/0017* (2013.01); *G06F 2203/04102* (2013.01); *G06F 2203/04103* (2013.01); *G06F 2203/04111* (2013.01); *G06F 2203/04112* (2013.01)
(58) Field of Classification Search
  CPC .. G06F 2203/04111; G06F 2203/04112; G06F 2203/04103; G06F 3/0412; H05K 3/0017; H05K 3/00; H03K 17/962
  See application file for complete search history.

(56) References Cited

U.S. PATENT DOCUMENTS

| | | | |
|---|---|---|---|
| 8,912,539 | B2 | 12/2014 | Yang |
| 9,268,168 | B2 | 2/2016 | Yi et al. |
| 9,411,080 | B2* | 8/2016 | Katagiri ............... G06F 3/0445 |
| 9,983,705 | B2* | 5/2018 | Lim ....................... G06F 3/041 |
| 10,019,084 | B2 | 7/2018 | Hwang et al. |
| 10,051,727 | B2* | 8/2018 | Lim ..................... H05K 1/0353 |
| 2011/0088770 | A1* | 4/2011 | Allemand ........... H01L 51/5212 136/256 |
| 2012/0318585 | A1* | 12/2012 | Kim ......................... H05K 3/06 178/18.03 |
| 2013/0140065 | A1* | 6/2013 | Koo ..................... H05K 3/4644 174/256 |
| 2014/0016278 | A1* | 1/2014 | Hwang .................... H05K 3/10 361/728 |
| 2014/0159255 | A1 | 6/2014 | Li et al. |
| 2014/0240624 | A1* | 8/2014 | Misaki ................. G06F 3/0446 349/12 |
| 2014/0251429 | A1* | 9/2014 | Lim ............... H01L 31/022466 136/256 |
| 2014/0253495 | A1 | 9/2014 | Kang et al. |
| 2014/0292714 | A1* | 10/2014 | Lee ......................... G06F 3/046 345/174 |
| 2015/0009432 | A1* | 1/2015 | Katagiri ............... G02B 5/0268 349/12 |
| 2015/0015532 | A1 | 1/2015 | Choung et al. |
| 2015/0029148 | A1 | 1/2015 | Wang et al. |
| 2015/0029420 | A1 | 1/2015 | Wu et al. |
| 2015/0075596 | A1* | 3/2015 | Lim ..................... H05K 1/0298 136/256 |
| 2015/0115254 | A1 | 4/2015 | Choi et al. |
| 2015/0130745 | A1* | 5/2015 | Choi .................... G06F 3/0446 345/174 |
| 2015/0167177 | A1* | 6/2015 | Choi .................... G06F 3/0446 200/5 R |
| 2015/0185890 | A1* | 7/2015 | Kaneko ................. G06F 3/041 428/457 |
| 2015/0205326 | A1* | 7/2015 | Lim ........................ B32B 27/06 345/174 |
| 2015/0223326 | A1* | 8/2015 | Lim ........................ G06F 1/16 345/174 |
| 2015/0253899 | A1 | 9/2015 | Yang et al. |
| 2015/0261370 | A1 | 9/2015 | Yoo et al. |
| 2015/0293560 | A1* | 10/2015 | Choi .................... G06F 3/0446 345/174 |
| 2015/0373844 | A1* | 12/2015 | Yoon ...................... G06F 3/047 345/173 |
| 2016/0041644 | A1* | 2/2016 | Bae ....................... G06F 3/0443 345/174 |
| 2016/0041647 | A1* | 2/2016 | Bae ....................... H05K 3/4644 345/174 |
| 2016/0116641 | A1 | 4/2016 | Minami et al. |
| 2016/0253009 | A1 | 9/2016 | Xie et al. |
| 2016/0282982 | A1 | 9/2016 | Hwang et al. |
| 2016/0282987 | A1 | 9/2016 | Choi et al. |
| 2016/0291712 | A1* | 10/2016 | Lim ......................... H05K 3/10 |
| 2017/0024037 | A1* | 1/2017 | Ishizaki ................ G06F 3/0446 |
| 2017/0200525 | A1* | 7/2017 | Kim ..................... H01B 13/0016 |
| 2017/0308213 | A1* | 10/2017 | Lee ....................... G06F 3/0445 |
| 2017/0344151 | A1* | 11/2017 | Yoshiki .................. G06F 3/044 |
| 2018/0224960 | A1* | 8/2018 | Park ...................... G06F 3/041 |
| 2018/0329534 | A1* | 11/2018 | Hwang ................ G06F 3/0416 |

FOREIGN PATENT DOCUMENTS

| | | |
|---|---|---|
| CN | 104656330 | 5/2015 |
| CN | 104756050 | 7/2015 |
| KR | 10-2013-0062114 | 6/2013 |
| KR | 10-2014-0024622 | 3/2014 |
| KR | 10-2014-0025251 | 3/2014 |
| KR | 10-2014-0070340 | 6/2014 |
| KR | 10-2015-0000778 | 1/2015 |
| KR | 10-2015-0008711 | 1/2015 |
| KR | 10-2015-0051507 | 5/2015 |
| KR | 10-2015-0087613 | 7/2015 |
| KR | 10-1591334 | 1/2016 |

OTHER PUBLICATIONS

Non-Final Office Action dated Jun. 13, 2019 issued to U.S. Appl. No. 15/367,730.
Non-Final Office Action dated Nov. 21, 2019 issued to U.S. Appl. No. 15/367,730.
Notice of Allowance dated Apr. 29, 2020 issued to U.S. Appl. No. 15/367,730.

* cited by examiner

TOUCH PANEL, ELECTRONIC DEVICE INCLUDING SAME, AND METHOD FOR MANUFACTURING TOUCH PANEL

CROSS-REFERENCE TO RELATED APPLICATION

This application is a divisional of U.S. patent application Ser. No. 15/367,740, filed on Dec. 2, 2016, which claims priority from and the benefit of Korean Patent Application No. 10-2016-0068366, filed on Jun. 1, 2016, which is hereby incorporated by reference for all purposes as if fully set forth herein.

BACKGROUND

Field

Exemplary embodiments employing the inventive concepts relate generally to a touch panel, an electronic device including the same, and a method for manufacturing a touch panel, and more particularly, to a touch panel with decreased pattern visibility, an electronic device including the same, and a method for manufacturing the touch panel.

Discussion of the Background

Electronic devices are activated by applied electrical signals. Electronic devices may include a touch screen for sensing a touch applied from outside the electronic device, and a display apparatus for displaying an image, where the display apparatus also is able to sense a touch applied from outside the electronic device.

The electronic devices may include various electrode patterns so as to be activated by an electronic signal. The region in which the electrode patterns are activated displays information or responds to a touch applied from the outside by a user.

The touch screen includes internal touch sensors that sense when a touch is applied from the outside. External light is reflected by the touch screen such that the touch sensors are visible due to the reflected external light. The visibility of the touch sensors is undesirable. For example, when the touch sensors visibly reflect external light, this light interferes with the visibility of content displayed on the touch screen.

Electronic devices that include touch screens have a thickness. The thickness is undesirable because, for example, it adds weight and expense to the device and adds inconvenience to carry, use and handle the device.

Structure that seeks to limit the reflectivity of a touch screen may also inhibit an aperture ratio of the pixels of the touch screen. In other words, the attempt to reduce the reflection of external light may also inhibit the visibility of desirable light produced by the touch screen by reducing the viewing angle through which light may be emitted.

The above information disclosed in this Background section is only for enhancement of understanding of the background of the inventive concepts, and, therefore, it may contain information that does not form the prior art that is already known in this country to a person of ordinary skill in the art.

SUMMARY

A touch panel constructed according to the principles of the invention and an electronic device including the same are capable of preventing touch sensors incorporated in the device from being viewed due to the reflection of external light by reducing external light reflectivity, e.g., through a darkening layer. Various exemplary embodiments of the invention may also decrease the thickness of an electronic device having a touch screen as compared to conventional devices and/or increase the aperture ratio of the pixels of the touch screen. The foregoing benefits may be achieved simultaneously in some embodiments.

Exemplary embodiments of the invention also provide a method for manufacturing a touch panel capable of stably forming a conductive pattern with decreased reflectivity of external light.

Additional aspects will be set forth in the detailed description which follows, and, in part, will be apparent from the disclosure, or may be learned by practice of the inventive concept.

According to one aspect of the invention, a touch panel constructed according to the principles of the invention includes a base layer including an active region responsive to an external touch to generate an electronic signal and a peripheral region adjacent to the active region, and a first conductive pattern disposed on the active region and a second conductive pattern disposed on the peripheral region, each of the first conductive pattern and the second conductive pattern including a conductive layer having an external light reflectivity and a darkening layer disposed over the conductive layer, wherein each of the first and second conductive patterns may have an external light reflectivity lower than that of the conductive layer.

The external light reflectivity of each of the first and second conductive patterns may be about 4% or less.

The darkening layer may include a lower layer disposed directly on the conductive layer and including a first conductive material having an extinction coefficient of about 2.5 or less, an upper layer disposed on the lower layer and including a second conductive material having an extinction coefficient of about 2.5 or less, and a middle layer disposed between the upper layer and the lower layer and in contact with each of the upper and lower layers and including a third conductive material having a refractive index of about 2.3 or less.

A thickness of the darkening layer may be between about 500 Å and about 850 Å, inclusive.

The first and second conductive materials may be the same material.

The first conductive material may include a metal.

The third conductive material may be a transparent conductive oxide.

The third conductive material may have a resistivity of about $10^{-2}$ μΩcm or less.

The touch panel may further include an insulating layer disposed between the first conductive pattern and the base layer, wherein the first conductive pattern may include a plurality of first electrodes disposed on the insulating layer, extending in a first direction, and arranged in a second direction transverse to the first direction, and the second conductive pattern may include a plurality of first pads disposed on the insulating layer and respectively connected to one of the plurality of first electrodes.

The first conductive pattern may further include a plurality of first dummy patterns disposed on the insulating layer and insulated from the plurality of first electrodes, and the second conductive pattern may further include a plurality of second pads respectively connected to one of the plurality of first dummy patterns.

The touch panel may further include a third conductive pattern disposed above the insulating layer and the base member, wherein the third conductive pattern may include a plurality of second electrodes extending in the second direction, arranged in the first direction, and a plurality of second dummy patterns disposed between the second electrodes and insulated from the plurality of second electrodes, the plurality of second electrodes passing through the insulating layer and connected to the plurality of first dummy patterns.

The third conductive pattern may be a single layer.

The first conductive pattern may include a plurality of mesh lines crossing each other.

According to another aspect employing the inventive concepts, an electronic device includes a display member to display an image and a touch member including an active region disposed on a portion of the display member and which detects an external touch input and a peripheral region adjacent to the active region, wherein the touch member may include a first conductive pattern including a conductive layer disposed on the active region and containing a metal and a darkening layer disposed directly on the conductive layer and a second conductive pattern disposed on the peripheral region, and wherein the darkening layer may include a multiple layer structure comprising at least two materials of different thickness that create destructive interference and successively reflect incident light of reduced intensity compared to the incident light.

A lower layer may be disposed directly on the conductive layer and may contain a first conductive material having an extinction coefficient of about 2.5 or less, an upper layer may be disposed on the lower layer and may contain a second conductive material having an extinction coefficient of about 2.5 or less, and a middle layer may be disposed between the upper layer and the lower layer, being in contact with each of the upper layer and the lower layer, and may contain a third conductive material having a refractive index of about 2.5 or less, and the first conductive pattern may have external light reflectivity of less than about 4%.

The second conductive material may be the same material as the first conductive material.

The third conductive material may include a transparent conductive oxide.

The third conductive material may have a resistivity of about $10^{-2}$ µΩcm or less.

The first conductive pattern may include a plurality of mesh lines crossing each other.

The display member may include a first electrode, a pixel defining layer having openings exposing at least a portion of the first electrode, a light emitting layer disposed on the first electrode and overlapping the openings, a second electrode disposed on the light emitting layer, and an encapsulation layer covering the second electrode, wherein the first conductive pattern may overlap the pixel defining layer and might not overlap the light emitting layer.

The first conductive pattern may include a plurality of mesh lines crossing each other, and each of the plurality of mesh lines might not overlap the light emitting layer.

The first conductive pattern may be disposed directly on the encapsulation layer.

The electronic device may further include a black conductive pattern disposed between the encapsulation layer and the first conductive pattern and a cover layer disposed between the encapsulation layer and the first conductive pattern to cover the black conductive pattern. The black conductive pattern may have the same lamination structure as the second conductive pattern.

The black conductive pattern may be grounded.

According to yet another aspect of the invention, an exemplary method for manufacturing a touch panel includes sequentially forming, on a base member, a base conductive layer including a metal, a lower base layer including a first conductive material, a middle base layer including a second conductive material, and an upper base layer including a third conductive material, etching the upper base layer to form an upper layer, etching the middle base layer to form a middle layer, and etching the lower base layer and the base conductive layer to form a lower layer and a conductive layer. The upper layer, the middle layer, the lower layer, and the conductive layer may define a first conductive pattern. The first conductive material may have an extinction coefficient of about 2.5 or less. The second conductive material may have a refractive index of about 2.5 or less, and the third conductive material may have an extinction coefficient of about 2.5 or less.

The step of etching of the upper base layer may be performed by a dry etching process.

The step of etching the middle base layer may be performed by a wet etching process using an etching solution The third conductive material might not be etched by the etching solution The etching of the base lower layer and the base conductive layer may be performed by a single dry etching process such that the lower base layer and the base conductive layer may be both etched by the single dry etching process.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
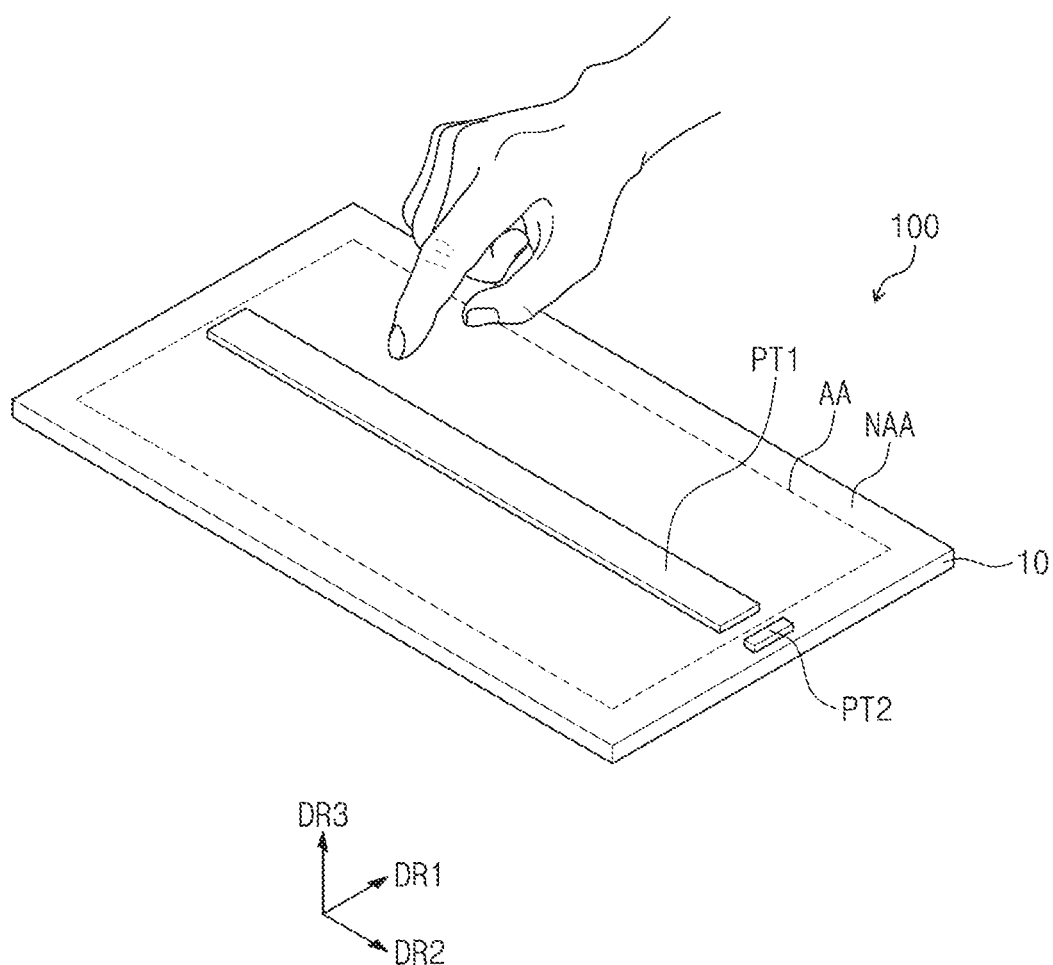
FIG. 1 is a perspective view of an electronic device constructed according to an exemplary embodiment employing the inventive concepts.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2A:
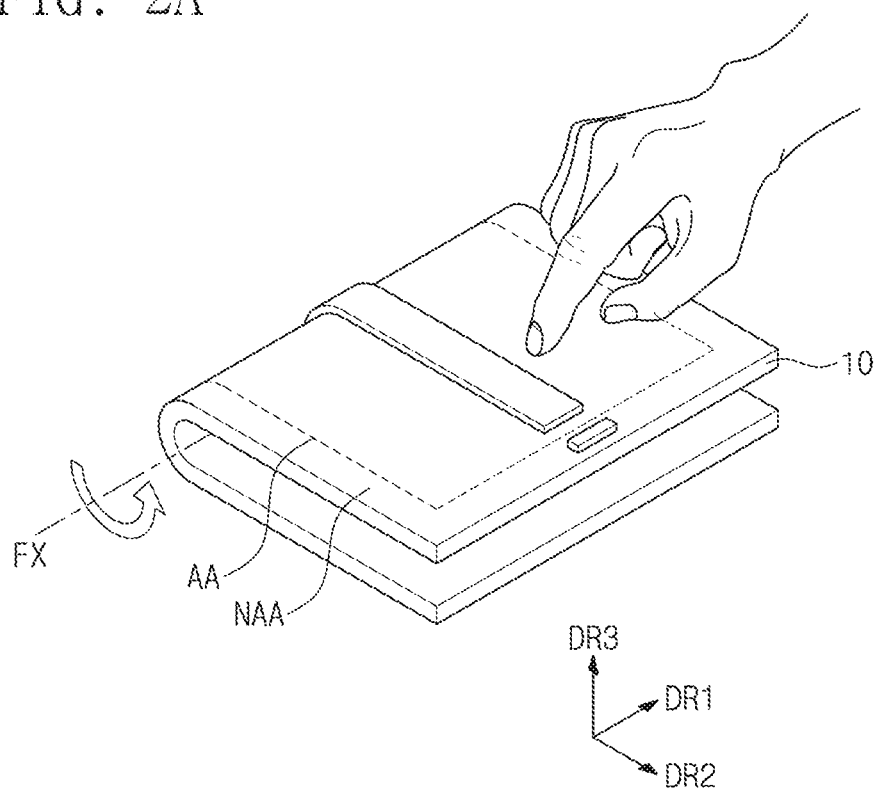
FIGS. 2A and 2B are perspective views illustrating a foldable electronic device constructed according to the inventive concepts.
Figure 2B:
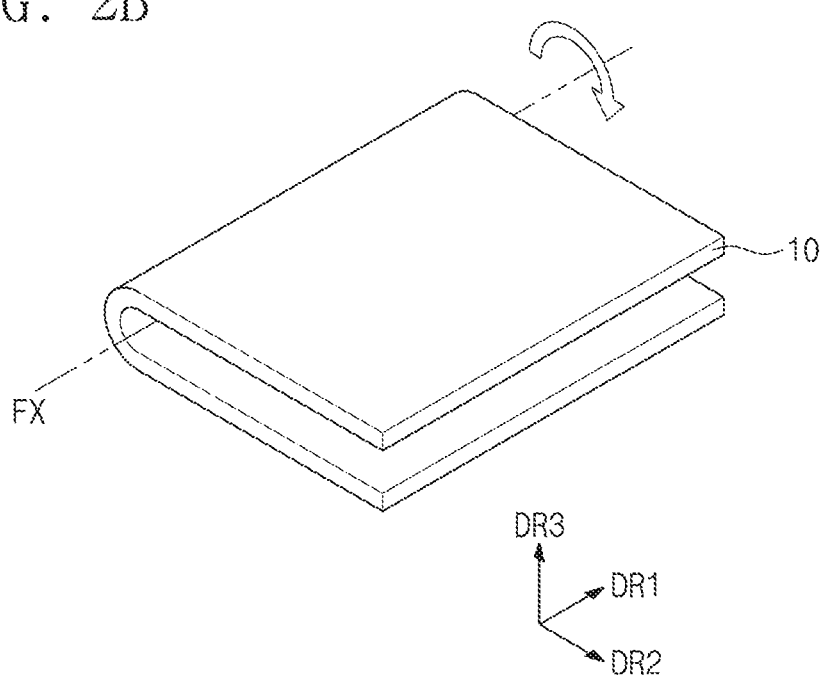

FIG. 1 shows an exemplary embodiment of an electronic device 100 constructed according to principles of the invention. FIGS. 2A and 2B illustrate examples in which the shape of an electronic device 100 of FIG. 1 is deformed by folding. Hereinafter, an electronic device according to an embodiment of the inventive concept will be described in detail with reference to FIGS. 1 to 2B.

In various exemplary embodiments, the electronic device 100 senses a touch applied from the outside. As illustrated in FIG. 1, the electronic device 100 may be divided into an active region AA and a peripheral region NAA when viewed in a plane defined by a first direction DR1 and a second direction DR2 transverse to the first direction DR1.

In various exemplary embodiments, the active region AA is activated by an electrical signal to sense a touch applied from the outside. As illustrated in FIG. 1, the active region AA may be defined to be concentrated in the center of the electronic device 100. However, this is illustrated as an example. The active region AA according to another embodiment may be defined on a periphery of the electronic device 100 or may also be partially defined on any one side, and the various exemplary embodiments are not limited to any one embodiment described herein.

In various exemplary embodiments, the peripheral region NAA is adjacent to the active region AA. In various exemplary embodiments, the electronic device 100 does not sense a touch applied to the peripheral region NAA. FIG. 1 illustrates an exemplary embodiment in which the peripheral region NAA has a frame shape surrounding the active region AA.

In various exemplary embodiments, the electronic device 100 includes a base member 10, a first conductive pattern PT1, and a second conductive pattern PT2. The base member 10 may be a base layer on which may be disposed the first and second conductive patterns PT1 and PT2.

The base member 10 may be electrically insulated. For example, the base member 10 may be an insulating substrate such as a glass substrate or a plastic substrate. Alternatively, the base member 10 may be a flexible insulating film. Alternatively, the base member 10 may be a thin film layer in which organic and/or inorganic layers are alternately laminated. The base member 10 may take various other exemplary embodiments as well. Thus, the embodiment of the base member is not limited to any one example described herein.

In various exemplary embodiments, the first conductive pattern PT1 is disposed on the active region AA. The first conductive pattern PT1 may be a sensing electrode. A touch applied to the active region AA may be actually sensed by the first conductive pattern PT1.

In various exemplary embodiments, the second conductive pattern PT2 is disposed on the peripheral region NAA. FIG. 1 illustrates an exemplary embodiment in which the second conductive pattern PT2 is spaced apart and insulated from the first conductive pattern PT1. However, the second conductive pattern PT2 according to alternative embodiments may be directly or indirectly connected to the first conductive pattern PT1 and the first conductive pattern PT1 and the second conductive pattern PT2 may thereby be electrically connected to each other. As with the foregoing, the orientation and structure of the conductive patterns is not limited to any one embodiment described herein.

The second conductive pattern PT2 may be a pad. The electronic device 100 may be provided with a power source through the second conductive pattern PT2 or may provide a touch signal sensed by the first conductive pattern PT1 to an external device through the second conductive pattern PT2.

As illustrated in FIGS. 2A and 2B, the electronic device 100 may be folded about a folding axis FX extending in the first direction DR1. Here, the elements of the electronic device 100 are depicted overlapping. To achieve such an orientation, the folding axis FX may have high flexibility.

Accordingly, at least the base member 10 and the first conductive pattern PT1 may be designed to have high flexibility. For example, the base member 10 and the first conductive pattern PT1 each may be formed of flexible materials or may have highly flexible structure as is known in the art.

As illustrated in FIG. 2A, the electronic device 100 may be folded about the folding axis FX such that the active region AA and the first conductive pattern PT1 may be exposed to the outside. Accordingly, the electronic device 100 may sense a touch applied from the outside even in a folded state.

As illustrated in FIG. 2B, the electronic device 100 may also or alternatively be folded about the folding axis FX such that the active region AA and the first conductive pattern PT1 may be covered by the base member 10. Accordingly, the electronic device 100 may protect the active region AA in such a folded state.

Figure 3A:
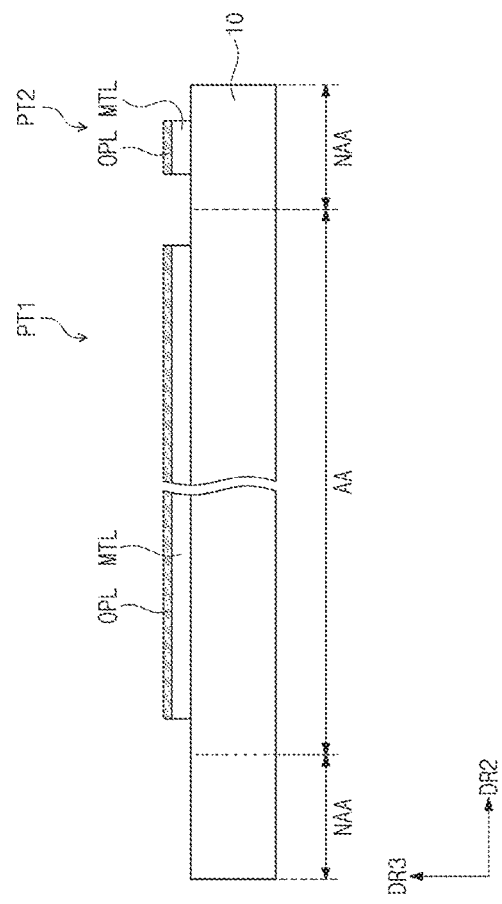
FIG. 3A is a cross-sectional view of the electronic device of FIG. 1.
Figure 3B:
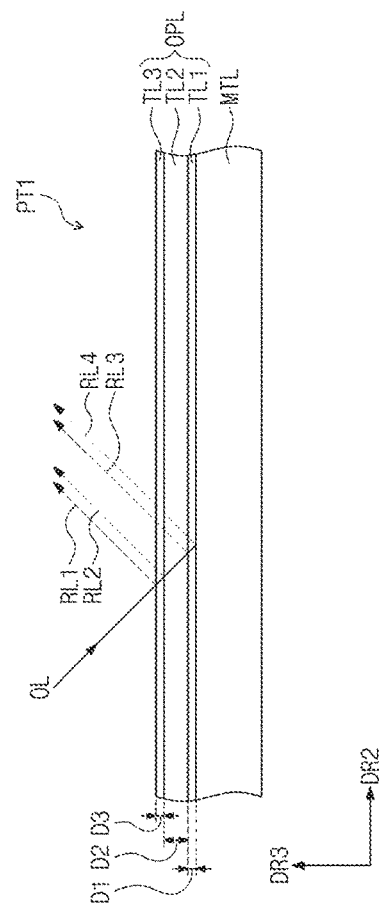
FIG. 3B is an enlarged partial cross-sectional view illustrating a portion of the electronic device of FIG. 3A.

FIG. 3A is a cross-sectional view of the electronic device illustrated in FIG. 1. FIG. 3B illustrates an example of the first conductive pattern PT1. Hereinafter, with reference to FIGS. 3A and 3B, the first conductive pattern PT1 and the second conductive pattern PT2 will be described in detail. Like reference numerals denote like elements in the same configuration as those illustrated in FIGS. 1 to 2B, and overlapping descriptions thereof will not be provided.

As illustrated in FIG. 3A, in various exemplary embodiments the first conductive pattern PT1 and the second conductive pattern PT2 are disposed on the base member 10. The first conductive pattern PT1 may be disposed on the active region AA and the second conductive pattern PT2 may be disposed on the peripheral region NAA.

In various exemplary embodiments, the first conductive pattern PT1 includes a conductive layer MTL and a darkening layer OPL which are sequentially laminated in an upward direction (hereinafter, referred to as a third direction). The conductive layer MTL may include a highly conductive material.

For example, the conductive layer MTL may include a metal, such as aluminum, copper, molybdenum, gold, titanium, chromium, nickel, iron, zinc, indium, gallium, magnesium, or manganese.

The darkening layer OPL may be disposed on the conductive layer MTL to cover the conductive layer MTL. In various exemplary embodiments, the darkening layer OPL optically reduces the external light reflectivity of the first conductive pattern PT1. The external light reflectivity of the first conductive pattern PT1 may be lower than that of the conductive layer MTL by further including the darkening layer OPL.

Referring to FIG. 3B, external light OL incident on the upper side of the first conductive pattern PT1 is firstly incident on the darkening layer OPL rather than on the conductive layer MTL. The darkening layer OPL may compensate for the relatively high reflectivity optical characteristic of the conductive layer MTL such that the darkening layer OPL may thereby control the reflectivity of the first conductive pattern PT1.

In various exemplary embodiments, the darkening layer OPL includes a lower layer TL1, a middle layer TL2, and an upper layer TL3 which are sequentially laminated in the third direction DR3. The reflectivity of the external light OL on the first conductive pattern PT1 may thus be controlled by successively passing through combinations of each constituent material and by the thickness of each of the lower layer TL1, the middle layer TL2, and the upper layer TL3.

The lower layer TL1 may be disposed directly on the conductive layer MTL. The lower layer TL1 may include a first conductive material. The first conductive material may be a material having an extinction coefficient, as that term is known in the light adsorption field and discussed more herein, of about 2.5 or less. For example, the first conductive material may be a metal.

The lower layer TL1 may have a first thickness D1. The first thickness D1 may be designed according to optical characteristics in consideration of the relation between the material constituting the lower layer TL1 and another layer brought in contact with the lower layer TL1. For example, the first thickness D1 may be about 50 Å to about 150 Å inclusive.

A predetermined material may have a complex refractive index according to a combination of a real number part and an imaginary number part. The complex refractive index may be defined by the following equation.

$$N=n+ki \qquad \text{[Equation]}$$

(where, N: complex refractive index, n: refractive index, k: extinction coefficient, i: imaginary number)

In the above equation, the extinction coefficient is a factor corresponding to the imaginary number part of the complex refractive index and represents a degree of light absorption. The refractive index may be defined as a factor corresponding to the real number part of the complex refractive index.

In various exemplary embodiments, the middle layer TL2 is disposed directly on the lower layer TL1. Accordingly, the middle layer TL2 and the lower layer TL1 may form an interface there between.

The middle layer TL2 may include a second conductive material. The second conductive material may be a material having a refractive index of about 2.5 or less. Also, the middle layer TL2 may be optically transparent. For example, the second conductive material may be a transparent conductive oxide.

The middle layer TL2 has a second thickness D2. Like the first thickness D1, the second thickness D2 may also be designed in consideration of the relation between an optical constant of the second conductive material and layers brought in contact with the middle layer TL2. For example, the second thickness D2 may be about 400 Å to about 550 Å inclusive. Thus, the second thickness may be different than the first thickness D1.

In various exemplary embodiments, the upper layer TL3 is disposed directly on the middle layer TL2. Accordingly, the upper layer TL3 and the middle layer TL2 form an interface there between.

The upper layer TL3 may include a third conductive material. The third conductive material may be a material having an extinction coefficient of about 2.5 or less. Also, the third conductive material may thus be the same as the first conductive material.

The upper layer TL3 has a third thickness D3. Like the first thickness D1, the third thickness D3 may also be designed in consideration of the relation between an optical constant of the third conductive material and layers brought in contact with the upper layer TL3. For example, the third thickness D3 may be about 50 Å to about 150 Å inclusive. Thus, the third thickness D3 may be different than the second thickness D2. The third thickness may be the same as the first thickness D1; or, the third thickness D3 may be different than the first thickness D1. And, a thickness of the entire darkening layer OPL, including the lower layer TL1, the middle layer TL2 and the upper layer TL3 having the exemplary thicknesses specified above, may be about 500 Å to about 850 Å inclusive.

More specifically, the external light OL incident on the upper side of the first conductive pattern PT1 is reflected from each of the layers constituting the darkening layer OPL, i.e., TL1, TL2 and TL3 in the embodiment illustrated in FIG. 3B, to generate a plurality of reflective lights in succession. A portion of the external light OL may be reflect from the upper layer TL3 to form first reflective light RL1, and a portion may pass through the upper layer TL3 having the third thickness D3 and be reflected from the upper surface of the middle layer TL2 to form second reflective light RL2. Also, a portion may pass through the middle layer TL2 having the second thickness D2 and be reflected from the upper surface of the lower layer TL1 to form third reflective light RL3, and another portion may pass through the lower layer TL1 having the first thickness D1 and be reflected from the upper surface of the conductive layer MTL to form fourth reflective light RL4.

In various exemplary embodiments, the first to fourth reflective lights RL1, RL2, RL3, and RL4 have wavelengths different from each other that are mixed with each other to generate destructive interference. Accordingly, the light strength of the light of a reflective light produced by the first to fourth reflective lights RL1, RL2, RL3, and RL4 is greatly decreased in comparison with the light strength of the external light OL and in comparison to the light strength of the reflective light RL4 in the absence of the darkening layer OPL.

In various exemplary embodiments, the first conductive pattern PT1 may have an external light reflectivity of less than about 4% by further including the darkening layer OPL. Accordingly, the first conductive pattern PT1 may substantially exhibit a black color or a dark color similar to the black color. The first conductive pattern PT1 may absorb most of the external incident light by further including the darkening layer OPL. Thus, a user may not easily view the first conductive pattern PT1 due to the reflection of external light.

Also, the darkening layer OPL electrically prevents the conductivity of the first conductive pattern PT1 from being degraded. The middle layer TL2 of the darkening layer OPL may be configured from a material having a resistivity of about $10^{-2}$ μΩcm or less.

In various exemplary embodiments, the darkening layer OPL has a predetermined conductivity. Accordingly, the contact resistance between the darkening layer OPL and the conductive layer MTL may be maintained to be substantially close to zero.

The first conductive pattern PT1 may prevent electrical characteristics from being degraded while having an optical effect of reducing the external light reflectivity by further including the darkening layer OPL. Accordingly, the electronic device 100 constructed according to the inventive concepts maintains touch sensitivity while reducing visibility of the underlying conductive pattern.

Also, the second conductive pattern PT2 may have the same structure as the first conductive pattern PT1. Since the contact resistance of a structure in which the conductive layer MTL and the darkening layer OPL are laminated is low, the structure may be easily used in a pad requiring improved electrical characteristics. Also, since the first and second conductive patterns PT1 and PT2 have the same structure in various exemplary embodiments, the first and second conductive patterns PT1 and PT2 may be simultaneously formed, thereby simplifying the process.

Hereinafter, with reference to FIG. 4, an exemplary electronic device 100-1 will be described. Like reference numerals denote like elements in the same configuration as those illustrated in FIGS. 1 to 3, and overlapping descriptions thereof will not be provided.

Figure 4:
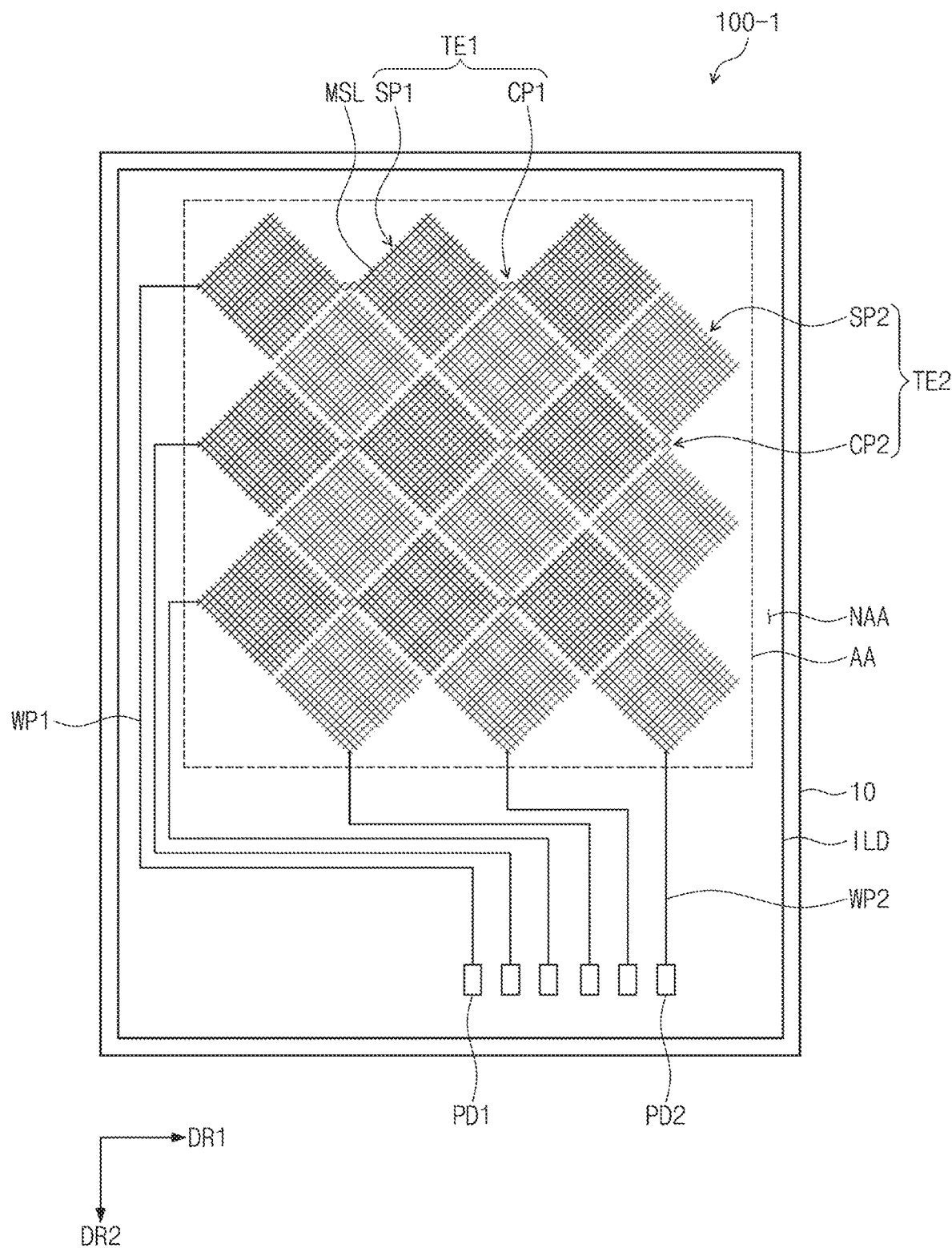
FIG. 4 is a plan view of an electronic device constructed according to another exemplary embodiment of the invention.

As illustrated in FIG. 4, the electronic device 100-1 may include a base member 10, an insulating layer ILD, a first electrode TE1, a second electrode TE2, first lines WP1, second lines WP2, a first pad PD1, and a second pad PD2. The base member 10 may correspond to the base member 10 illustrated in FIG. 1.

In various exemplary embodiments, the first and second electrodes TE1 and TE2 are disposed on an active region AA. The first conductive pattern PT1 (see FIG. 1) illustrated in FIG. 1 may include the first and second electrodes TE1 and TE2. Accordingly, first and second electrodes TE1 and TE2 may respectively include a conductive layer MTL (see FIG. 3A) and a darkening layer OPL (see FIG. 3A). However, this is illustrated as an example. In various exemplary alternative embodiments, only one of the first and second electrodes TE1 and TE2 corresponds to the first conductive pattern PT1.

In various exemplary embodiments, the first electrode TE1 extends in a first direction DR1. The first electrode TE1 may include a plurality of first sensor parts SP1 arranged in the first direction DR1, and may include a plurality of first connecting parts CP1 respectively connecting the first sensor parts adjacent to each other to the plurality of first sensor parts SP1. A plurality of the first electrodes TE1 may be provided, and, in various exemplary embodiments, arranged in a second direction DR2.

In various exemplary embodiments, the second electrode TE2 extends in a second direction DR2. The second electrode TE2 may include a plurality of second sensor parts SP2 arranged in the second direction DR2, and a plurality of second connecting parts CP2 respectively connecting the second sensor parts adjacent to each other to the plurality of second sensor parts SP2. A portion of the second connecting parts CP2 may extend across a portion of the plurality of first connecting parts CP1 when viewed in a plane.

The second electrode TE2 may be provided in plurality to be arranged in the first direction DR1. The plurality of second electrodes may extend across the plurality of first electrodes while remaining insulated therefrom.

As a touch is applied on the active region AA, electrostatic capacitance between the first and second electrodes TE1 and TE2 may be changed. In various exemplary embodiments, the electronic device 100-1 senses the touch through the change in the electrostatic capacitance between the first and second electrodes TE1 and TE2.

This is illustrated as an example. In various exemplary alternative embodiments, the electronic device 100-1 may sense the touch applied from the outside through various methods. For example, the electronic device 100-1 may sense the touch through methods such as a resistive film method, an optical method, an ultrasonic method, or a coordinate recognition method, and may have respective electrode structures corresponding to the methods.

Also, in various exemplary embodiments, each of the first and second electrodes TE1 and TE2 may include a plurality of mesh lines MSL crossing each other. Accordingly, the first and second electrodes TE1 and TE2 may have improved flexibility and thus the folding characteristic of the electronic device 100-1 may be improved.

In various exemplary embodiments, the first and second pads PD1 and PD2 are disposed on a peripheral region NAA. The second conductive pattern PT2 (see FIG. 1) may include the first and second pads PD1 and PD2. Accordingly, each of the first and second pads PD1 and PD2 may include a conductive layer MTL and a darkening layer OPL. However, this is illustrated as an example. In various exemplary alternative embodiments, only one of the first and second pads PD1 and PD2 corresponds to the second conductive pattern PT2.

In various exemplary embodiments, the first pad PD1 is connected to the first electrode TE1 to thereby provide the first electrode TE1 with an electrical signal or to transmit an electrical signal received from the first electrode TE1 to the outside. The second pad PD2 may be connected to the second electrode TE2 to thereby provide the second electrode TE2 with an electrical signal or to transmit an electrical signal received from the second electrode TE2 to the outside.

In various exemplary embodiments, the first and second lines WP1 and WP2 are disposed on the peripheral region NAA. The first and second lines WP1 and WP2 may also correspond to the second conductive pattern PT2. In various exemplary embodiments, all the conductive patterns disposed on the active region AA and the peripheral region NAA may be simultaneously formed to thereby simplify the manufacturing process and save manufacturing costs.

The first lines WP1 connect the first electrode TE1 and the first pad PD1 and the second lines WP2 may connect the second electrode TE2 and the second pad PD2. Even when the first and second lines WP1 and WP2 are formed by means of the second conductive pattern PT2, electrical characteristics are not degraded. Thus, the first and second lines WP1 and WP2 may easily serve as signal transmitting lines.

Figure 5A:
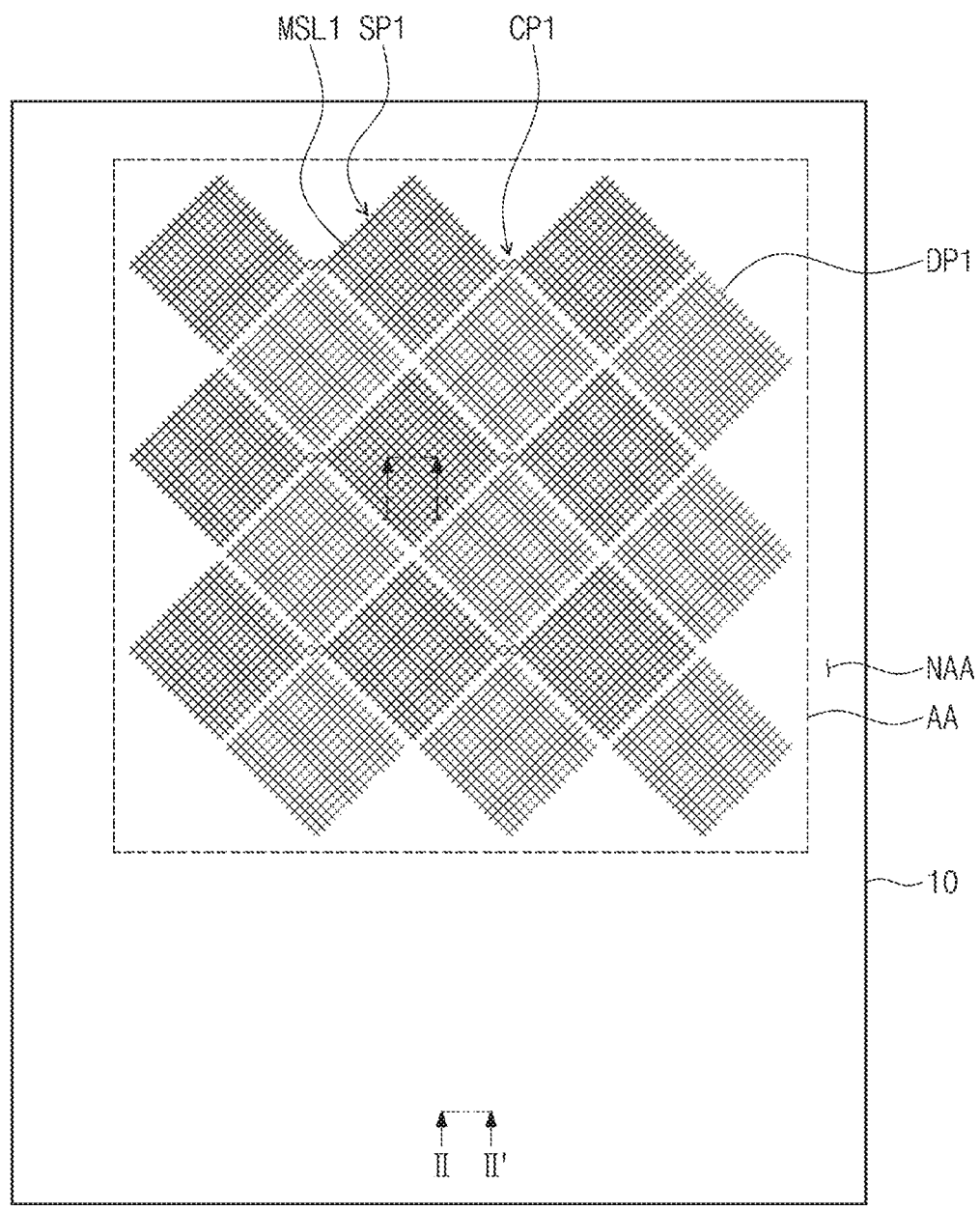
FIGS. 5A to 5C are plan views respectively illustrating selected portions of the electronic device of FIG. 4.
Figure 5B:
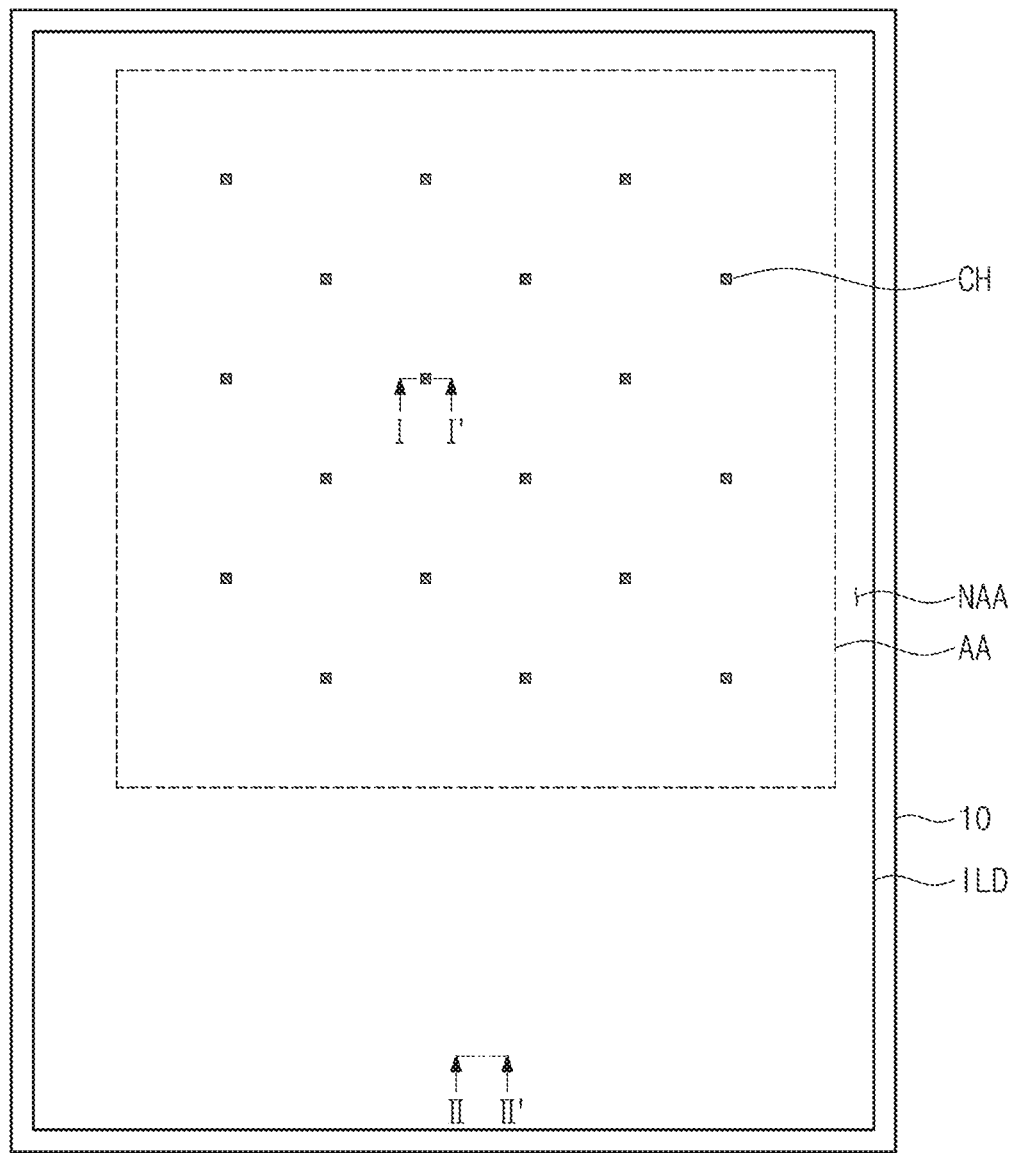
Figure 5C:
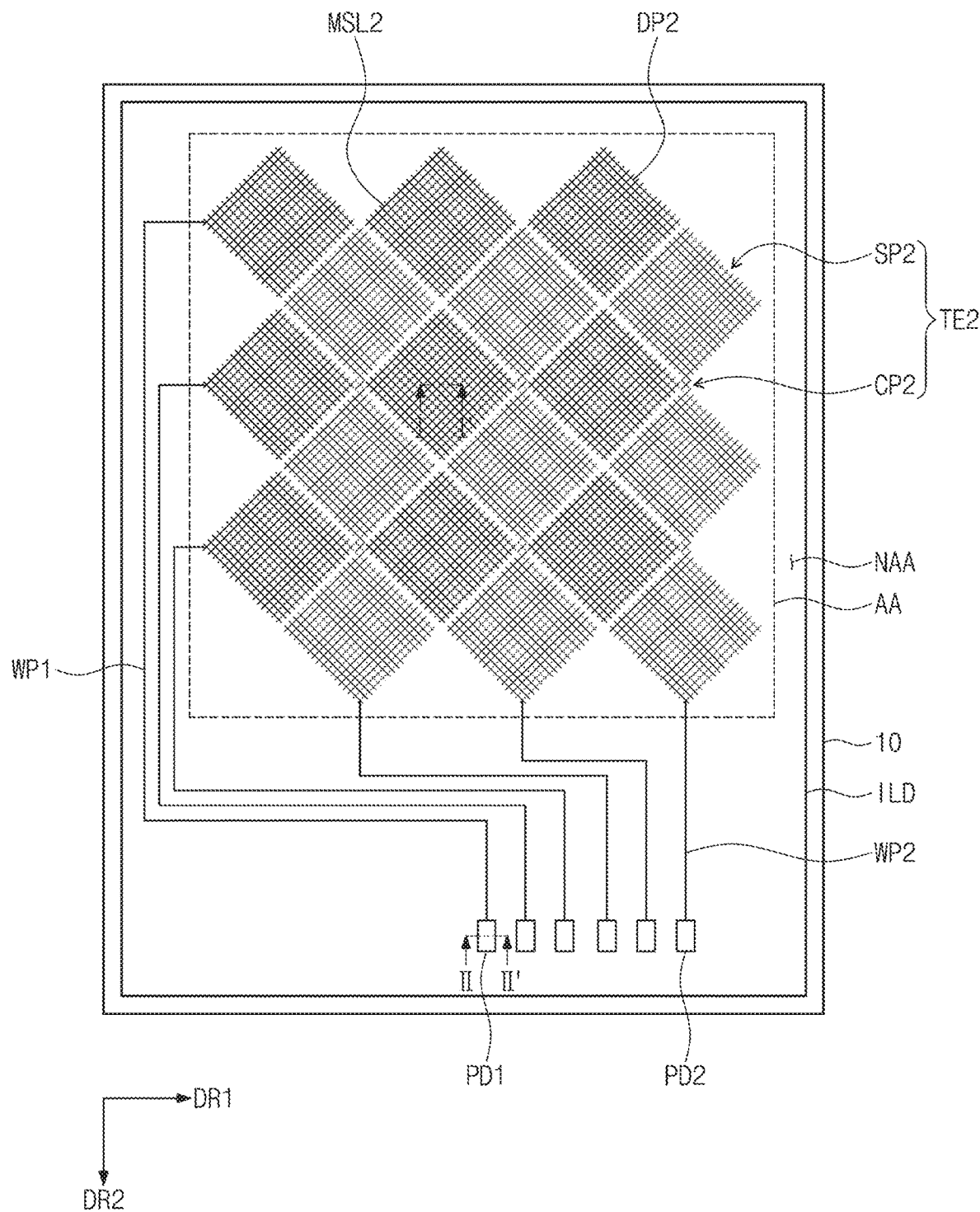

FIG. 5A illustrates the base member 10 and elements disposed on the base member 10, FIG. 5B illustrates the insulating layer ILD disposed on the base member 10, and FIG. 5C illustrates elements disposed on the insulating layer ILD. Hereinafter, with reference to FIGS. 5A and 6, exemplary electronic device 100-1 will be described.

As illustrated in FIG. 5A, a plurality of first mesh lines MSL1 may be disposed on the base member 10. The plurality of first mesh lines MSL1 may be disposed on the active region AA.

The plurality of first mesh lines MSL1 may be classified into the plurality of first sensors parts SP1 and the plurality of first connecting parts CP1 and a plurality of first dummy patterns DP1. The plurality of first sensor parts SP1 and the plurality of first connecting parts CP1 may be connected to each other to constitute the first electrode TE1.

In various exemplary embodiments, the plurality of first dummy patterns DP1 are disposed spaced apart and electrically insulated from the plurality of first sensor parts SP1 and from the plurality of first connecting parts CP1. The plurality of first dummy patterns DP1 may be disposed alternately with the plurality of first sensor parts SP1.

As illustrated in FIG. 5B, the insulating layer ILD may be disposed on the base member 10 to cover the plurality of first sensors parts SP1, the plurality of first connecting parts CP1, and a plurality of first dummy patterns DP1. The insulating layer ILD may include a transparent insulating material.

For example, the insulating layer ILD may be an organic film. Thus, the flexibility of the electronic device 100-1 may be improved. Alternatively, the insulating layer ILD may be an inorganic film. Accordingly, in various exemplary embodiments, the insulating layer ILD may be formed in a small thickness and may thereby enable electronic device 100-1 to be a slim device.

The insulating layer ILD may have an integral shape overlapping the active region AA and the peripheral region NAA. Predetermined contact holes CH may be defined in the insulating layer ILD.

In various exemplary embodiments, the contact holes CH are arranged to respectively corresponding to the plurality of dummy patterns DP1 and the plurality of sensor parts SP1. However, this is illustrated as an example. The plurality of contact holes may also, in alternative embodiments, respectively correspond to one of the plurality of the first dummy patterns DP1 or one of the plurality of the sensor parts SP1.

As illustrated in FIG. 5C, a plurality of second mesh lines MSL2, the plurality of first lines WP1, the plurality of second lines WP2, a first pad PD1, and a second pad PD2 may be disposed on the insulating layer ILD. In various exemplary embodiments, the plurality of second mesh lines MSL2 are disposed on the active region AA.

Respective portions of the plurality of second mesh lines MSL2 may be classified as the plurality of second sensors parts SP2, the plurality of second connecting parts CP2 and a plurality of second dummy patterns DP2. In various exemplary embodiments, the plurality of second sensor parts SP2 and the plurality of second connecting parts CP2 are connected to each other to constitute the second electrode TE2.

In various exemplary embodiments, when viewed in a plane, the plurality of second sensor parts SP2 overlap the plurality of first dummy patterns DP1. The plurality of second sensor parts SP2 may have substantially the same shape(s) as the plurality of first dummy patterns DP1. The plurality of second dummy patterns DP2 may be disposed spaced apart and electrically insulated from the plurality of second sensor parts SP2 and from the plurality of second connecting parts CP2.

The plurality of second dummy patterns DP2 may be disposed alternately with the plurality of second sensor parts SP2. When viewed in a plane, the plurality of second dummy patterns DP2 may overlap the plurality of first sensor parts SP1.

The plurality of first sensor parts SP1 may entirely overlap the plurality of second dummy patterns DP2. The plurality of first sensor parts SP1 may have substantially the same shape(s) as the plurality of second dummy patterns DP2.

Also, the plurality of second dummy patterns DP2 may overlap the plurality of contact holes CH. The plurality of second dummy patterns DP2 may be respectively connected to the plurality of first sensor parts SP1 through one portion of the contact holes CH. Accordingly, the first electrode TE1 may include the plurality of first sensors parts SP1, the plurality of first connecting parts CP1, and the plurality of second dummy patterns DP2.

Likewise, the plurality of first dummy patterns DP1 may overlap the plurality of contact holes CH. The plurality of first dummy patterns DP1 may be respectively connected to the plurality of second sensor parts SP2 through another portion of the contact holes CH. Accordingly, the second electrode TE2 may include the plurality of second sensors parts SP2, the plurality of second connecting parts CP2, and the plurality of first dummy patterns DP1.

The plurality of first lines WP1, the plurality of second lines WP2, the plurality of first pads PD1 and the plurality of second pads PD2 may be disposed on the insulating layer ILD. Since the plurality of second dummy patterns DP2 may be connected to the first sensor parts SP1 disposed under the insulating layer ILD, the plurality of first lines WP1 may be connected to the plurality of second dummy patterns DP2 and may thereby be electrically connected to the first sensor parts SP1. Accordingly, all the plurality of first lines WP1, the plurality of second lines WP2, the first pad PD1 and the second pad PD2 may be disposed on the same layer. Also, overlapping descriptions of the plurality of first lines WP1, the plurality of second lines WP2, the first pad PD1 and the second pad PD2 will not be provided.

Figure 6:
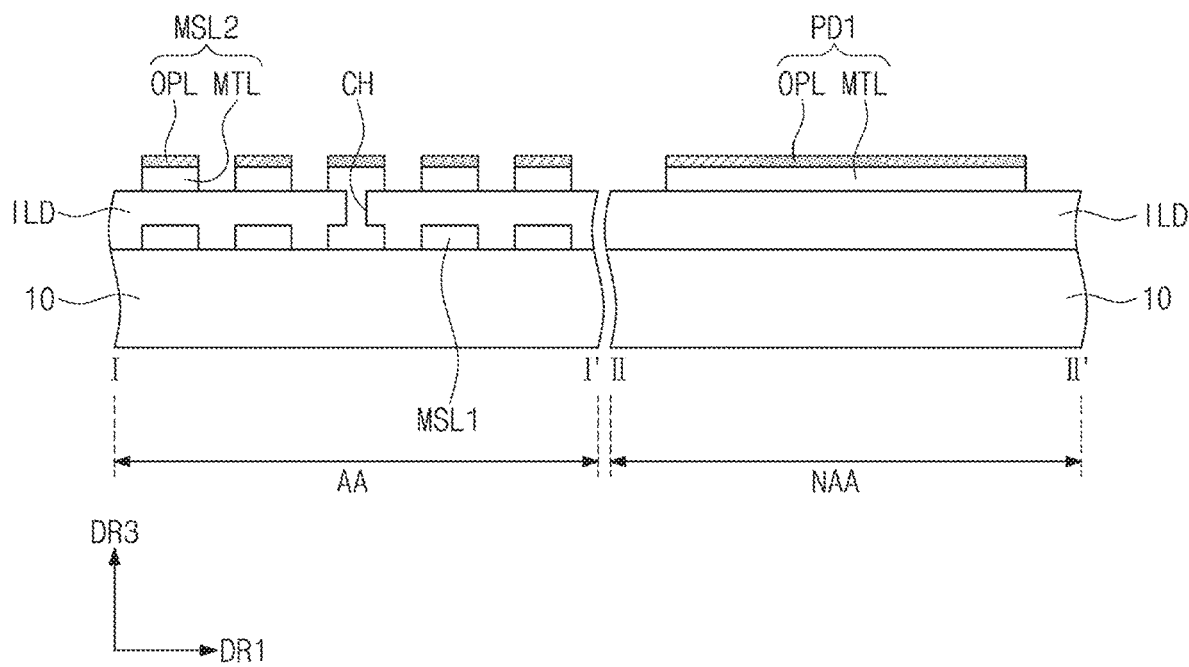
FIG. 6 is a cross-sectional view taken along lines I-I' and II-II' of FIGS. 5A to 5C.

As illustrated in FIG. 6, in various exemplary embodiments the plurality of first mesh lines MSL1 and the plurality of second mesh lines MSL2 are spaced apart from each other with the insulating layer ILD therebetween. One portion of the plurality of first mesh lines MSL1 and one portion of the plurality of second mesh lines MSL2 may be connected to each other through the contact holes CH.

In various exemplary embodiments, the plurality of first mesh lines MSL1 and the plurality of second mesh lines MSL2 which are disposed on a relatively upper side among the plurality of second mesh lines MSL2, may correspond to the above-described first conductive pattern PT1 (see FIG. 1). Accordingly, each of the second mesh lines MSL2 may include the conductive layer MTL and the darkening layer OPL which are sequentially laminated in the third direction DR3.

In various exemplary embodiments, the first pad PD1 disposed on the peripheral region NAA is disposed on the insulating layer ILD at a position which may be viewed from the outside. The first pad PD1 may correspond to the above-described second conductive pattern PT2 (see FIG. 1). Accordingly, the first pad PD1 may include the conductive layer MTL and the darkening layer OPL which may be sequentially laminated in the third direction DR3. Also, although not shown, the second pad PD2 may additionally include a structure corresponding to the first pad PD1.

As illustrated in FIG. 6, in various embodiments where an additional conductive pattern for covering the second mesh lines MSL2, the first pads PD1, and the second pads PD2 is not provided, the second mesh lines MSL2, the first pads PD1, and the second pads PD2 may be conductive patterns disposed on the uppermost layer, which are visible from the outside.

In various exemplary embodiments, the first conductive pattern PT1 is applied only to the second mesh lines MSL2, which affects the external light reflectivity of the electronic device 100-1, and thus has an effect of reducing the external light reflectivity and may simplify a process.

Also, in various exemplary embodiments, the second conductive pattern PT2 is applied to the first and second pads PD1 and PD2 and may thus maintain electrical characteristics and may be provided through the same process as the second mesh lines MSL2.

Hereinafter, with reference to FIG. 7, an electronic device 100-2 according to an embodiment of the inventive concept will be described. Like reference numerals denote like elements in the same configuration as those illustrated in FIGS. 1 to 6, and overlapping descriptions thereof will not be provided.

Figure 7:
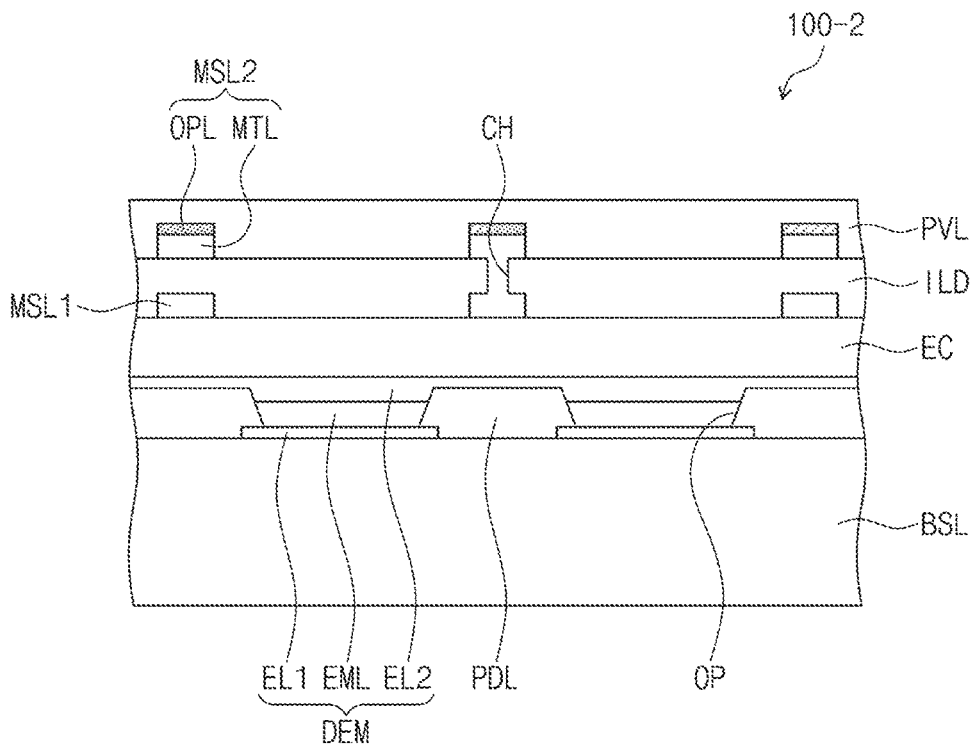
FIG. 7 is a cross-sectional view illustrating an electronic device constructed according to yet another exemplary embodiment.

As illustrated in FIG. 7, the electronic device 100-2 may include a base layer BSL, a display element DEM, a pixel defining layer PDL, a middle layer EC, a plurality of mesh lines MSL1, an insulating layer ILD, a plurality of second mesh lines MSL2, and a cover layer PVL. In various exemplary embodiments, the electronic device 100-2 may be a touch screen panel for displaying an image.

The base layer BSL may be an insulating substrate or an insulating film. The base layer BSL may be a bottom layer on which elements constituting the electronic device 100-2 are disposed. The base layer BSL may correspond to the base member 10 of FIG. 1.

Although not shown, the base layer BSL may include a plurality of insulating layers and a plurality of conductive layers. The plurality of insulating layers and the plurality of conductive layers may configure thin film transistors and capacitors which are connected to a display element DEM.

In various exemplary embodiments, the display element DEM is disposed on the base layer BSL. The display element DEM realizes an image by displaying light in response to electrical signals transmitted through the thin film transistors and capacitors.

The display element DEM may be formulated in a variety of different ways. For example, the display element DEM may be an electrophoretic element, a liquid crystal capacitor, an electro wetting element, or an organic light emitting element. In various exemplary embodiments, the display element DEM is an organic light emitting element, as will be further described below.

The pixel defining layer PDL may be disposed on the base layer BSL. Predetermined openings OP may be defined in the pixel defining layer PDL. Each of the openings OP may define a region into which one display element DEM is partitioned.

In various exemplary embodiments, the display element DEM includes a first electrode EL1, a light emitting layer EML, and a second electrode EL2. The display element DEM may generate light by activating the light emitting layer EML according to the potential difference between the first electrode EL1 and the second electrode EL2.

The middle layer EC may be disposed on the second electrode EL2. The middle layer EC may cover the display element DEM. The middle layer EC may electrically insulate the display element DEM from elements disposed on the middle layer EC.

The middle layer EC may include an organic film and/or an inorganic film. Here, the middle layer EC may be an encapsulation layer which prevents water from penetrating into the display element DEM and protects the display element DEM.

In various exemplary embodiments, the first mesh lines MSL1 are disposed on the encapsulation layer. Although not shown, the electronic device 100-2 may further include a color filter layer disposed between the encapsulation layer and the first mesh lines MSL1. The color filter layer may include a plurality of color patterns overlapping the openings OP and a matrix pattern overlapping the pixel defining layer PDL. The color filter layer reduces the external light reflectivity of a display substrate 20.

In various exemplary embodiments, the first and second mesh lines MSL1 and MSL2 overlap the pixel defining layer PDL and do not overlap the openings OP in which the light emitting layer EML is disposed. Accordingly, negative influence on the electronic device 100-2 due to the first and second mesh lines MSL1 and MSL2 may be reduced, and since the first and second mesh lines MSL1 and MSL2 may be fabricated from an opaque material, the degree of freedom of selecting a material for the first and second mesh lines MSL1 and MSL2 may be increased.

Also, the electronic device 100-2 may further include a passivation layer PVL for covering the second mesh lines MSL2. In various exemplary embodiments, the passivation layer PVL protects the second mesh lines MSL2.

Figure 8A:
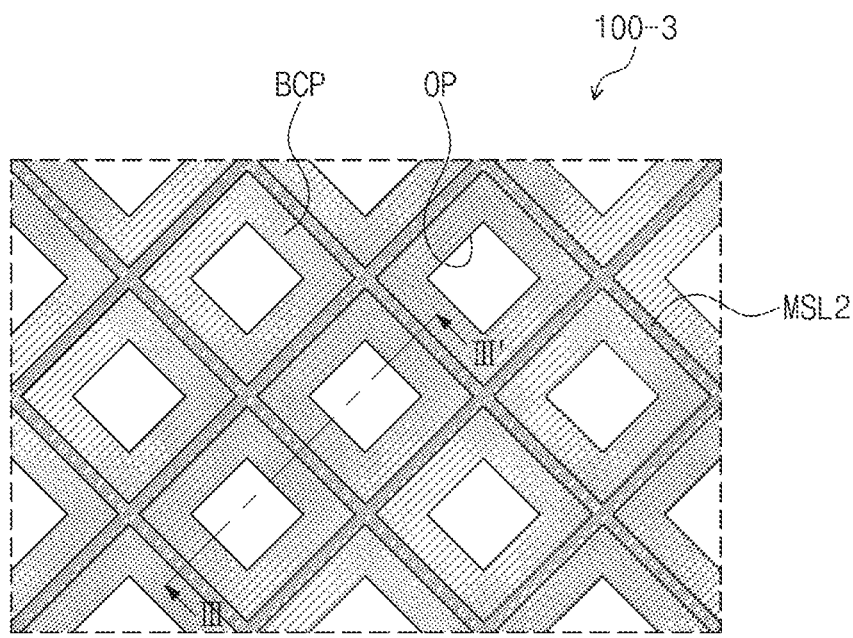
FIG. 8A is a plan view illustrating a portion of an electronic device constructed according to still another embodiment employing the inventive concepts.
Figure 8B:
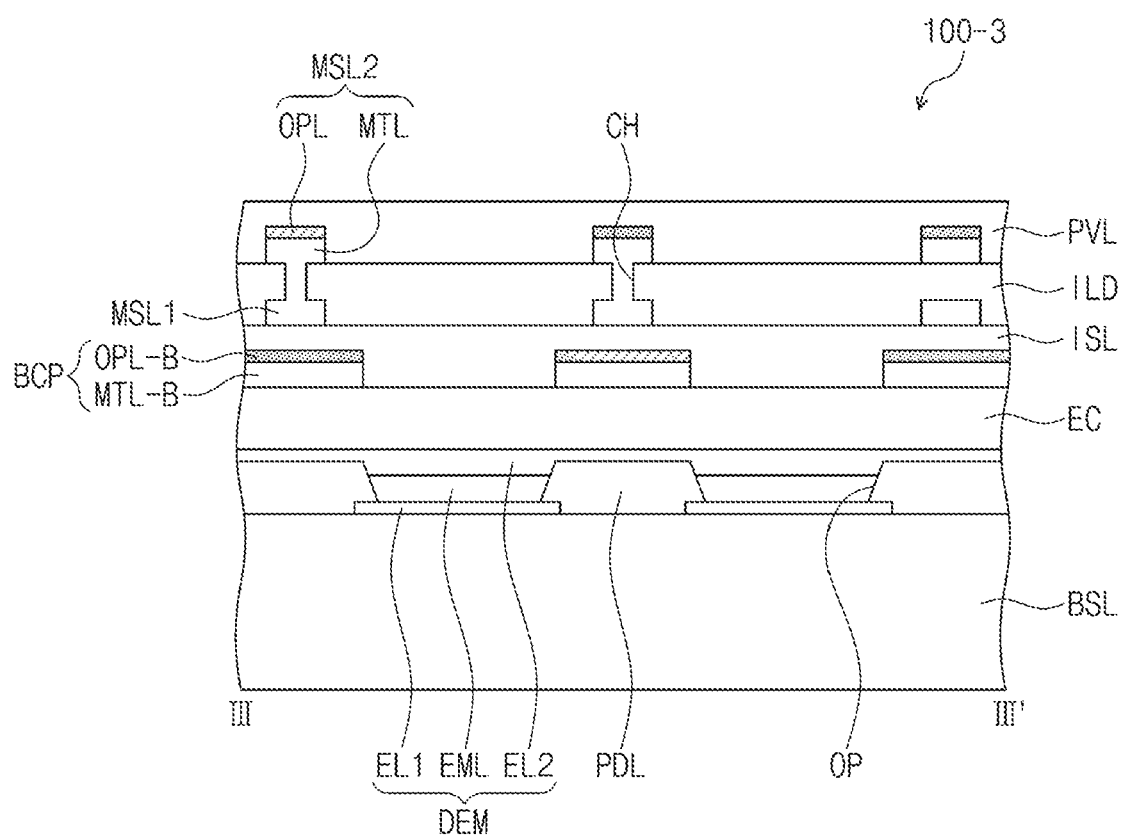
FIG. 8B is a cross-sectional view taken along line of FIG. 8A.
Figure 9A:
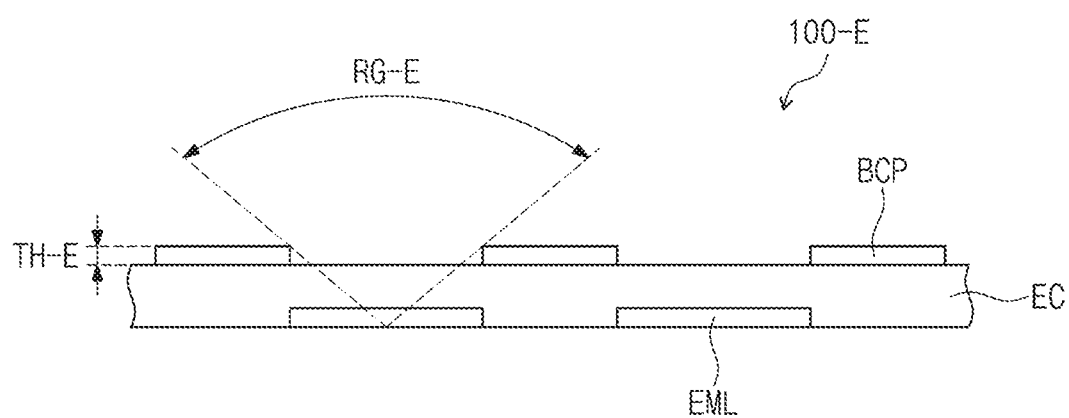
FIG. 9A is a partial schematic cross-sectional view illustrating an electronic device constructed according to a still further exemplary embodiment.
Figure 9B:
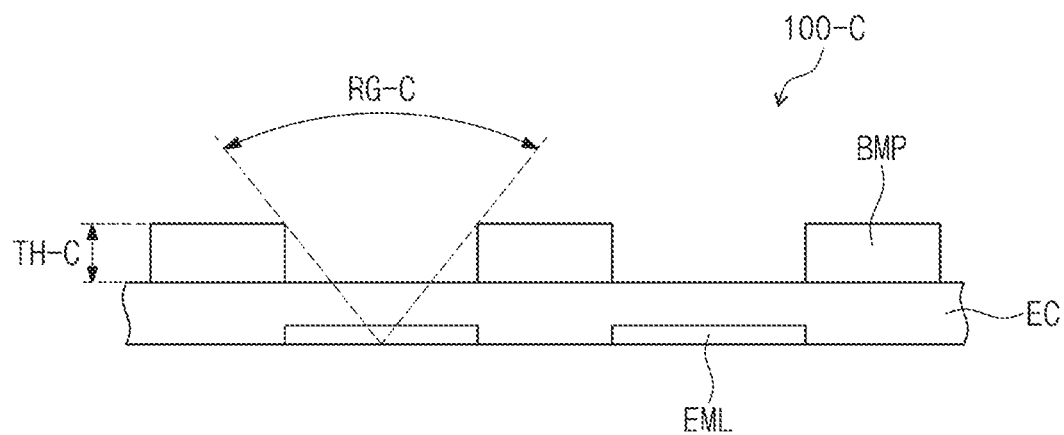
FIG. 9B is a partial schematic cross-sectional view illustrating an electronic device constructed according to a comparative embodiment.

With reference to various embodiments illustrated in FIGS. 8A to 9B, like reference numerals denote like elements in the same configuration as those illustrated in FIGS. 1 to 7, and therefore it is not necessary to provide separate descriptions of these like elements. For convenience of description, FIG. 9B illustrates, from a comparative example, a region corresponding to some regions of an electronic device 100-E illustrated in FIG. 9A.

As illustrated in FIGS. 8A and 8B, the electronic device 100-3 may further include a black conductive pattern BCP. The black conductive pattern BCP may overlap a pixel defining layer PDL, and, in various exemplary embodiments, does not overlap a light emitting layer EML. The black conductive pattern BCP may be disposed between a middle layer EC and first mesh lines MSL1.

The black conductive pattern BCP may correspond to a first conductive pattern PT1. Accordingly, the black conductive pattern BCP may include a conductive layer MTL-B and a darkening layer OPL-B which are sequentially laminated in a third direction DR3.

The electronic device 100-3 may further include a middle insulating layer ISL covering the black conductive pattern BCP. In various exemplary embodiments, the middle insulating layer ISL is disposed between the middle layer EC and the insulating layer ILD. The middle insulating layer ISL may cover the black conductive pattern BCP to thereby provide the first mesh lines MSL1 with a flat surface.

In various exemplary embodiments, the black conductive pattern BCP has a low external light reflectivity by including the darkening layer OPL-B. Accordingly, the black conductive pattern BCP may be viewed as having a dark color substantially close to black.

Referring to FIG. 8A, a conductive pattern for sensing a touch may be formed as a second mesh lines MSL2 including the darkening layer OPL, and thus the problem that a touch electrode is viewable from the outside may be prevented or reduced. Also, in various exemplary embodiments, a region corresponding to the pixel defining layer PDL is covered by the black conductive pattern BCP including the darkening layer OPL-B, and thus the problem that the boundary between the second mesh lines MSL2 and the peripheral regions thereof is viewable may be prevented or reduced.

Referring to the inventive embodiment illustrated in FIG. 9A, the black conductive pattern BCP has a first thickness TH-E. As described above, a conductive layer MTL-B constituting the black conductive pattern BCP may include an inorganic material such as a metal, and the darkening layer OPL-B may include an inorganic material such as a metal layer and/or a conductive oxide.

That is, the black conductive pattern BCP may be formed based on inorganic materials and may be formed through a thin film process such as a vapor deposition process and thus a first thickness TH-E may be relatively small.

Referring to FIG. 9B, comparative example 100-C may include a conventional black matrix BMP. In general, the black matrix BMP includes an organic material. Accordingly, the black matrix BMP has a second thickness TH-C greater than the first thickness TH-E.

Referring to FIGS. 9A and 9B, the emitting region of light generated from a light emitting layer EML may be different in the inventive embodiment of example 100-E and comparative example 100-C. While the thicknesses of the middle layers EC are the same as each other, the emitting region of light may be different according to the first thickness TH-E and the second thickness TH-C.

For example, a light divergence range RG-E according to the inventive example 100-E is greater than a light divergence range RG-C according to the comparative example 100-C. The light divergence ranges RG-E and RG-C may lead to increased effective light emitting area. This may have same effect as a substantially improved ratio of aperture of a display device. Accordingly, in various exemplary embodiments, an electronic device according to an example 100-E replaces the black matrix BMP with a black conductive pattern layer BCP, and thereby improves the aperture ratio of a pixel by increasing the angle through which light may be emitted.

Hereinafter, with reference to embodiments illustrated in FIGS. 10A and 10B, a black conductive pattern BCP will be described in detail. Like reference numerals denote like elements in the same configuration as those illustrated in FIGS. 1 to 9B, and overlapping descriptions thereof will not be provided.

Figure 10A:
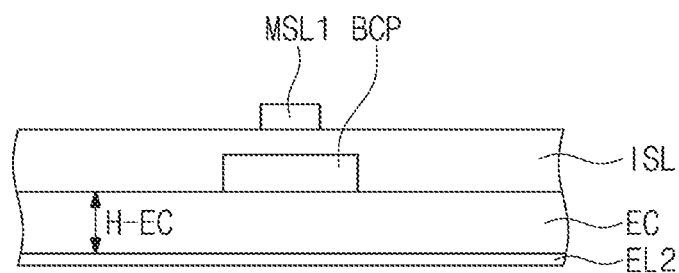
FIG. 10A is a partial schematic cross-sectional view illustrating a portion of an electronic device constructed according to another embodiment employing the inventive concepts.

FIG. 10A illustrates a second electrode EL2, a middle layer EC, a black conductive pattern BCP, a middle insulating layer ISL, and a plurality of mesh lines MSL in a display element DEM (see FIG. 7). Accordingly, in various exemplary embodiments, the middle layer EC has a predetermined thickness H-EC.

Figure 10B:
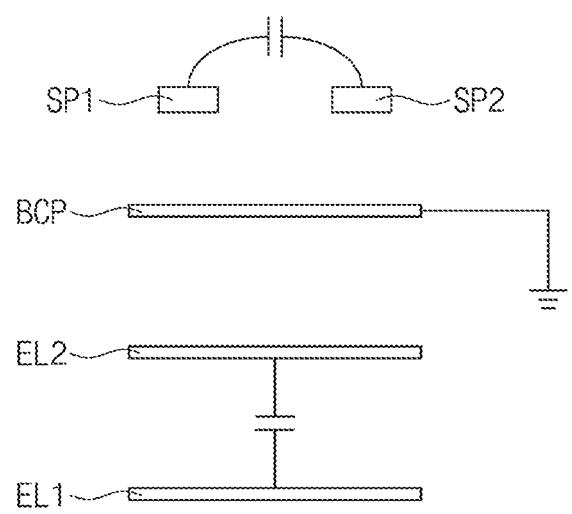
FIG. 10B is a partial schematic view illustrating electrical connections between certain components of an electronic device constructed according to an embodiment employing the inventive concepts.

Referring to FIG. 10B, the display of an image may be controlled by the first and second electrodes EL1 and EL2 which may be disposed under the black conductive pattern BCP. The first and second electrodes EL1 and EL2 form a capacitor with the light emitting layer (not shown) therebetween. That is, electrical signals different from each other may be transmitted to each of the first and second electrodes EL1 and EL2, and according to this, the emitting of light from the display element DEM is controlled.

A touch applied from the outside may be sensed according to a change in a capacitance between a first sensor part SP1 and a second sensor part SP2 which are disposed over the black conductive pattern BCP. That is, in various exemplary embodiments, electrical signals different from each other are transmitted to each of the first and second sensor parts SP1 and SP2, and according to this, the touch is sensed.

In various exemplary embodiments, the black conductive pattern BCP may have a conductivity and a ground voltage. Accordingly, the black conductive pattern BCP may function as a shielding electrode which independently operates the display element DEM disposed under the black conductive pattern BCP and the first and second sensor parts SP1 and SP2 which may be disposed over the black conductive pattern BCP.

As the black conductive pattern BCP is grounded, the problem of noise generated between the first and second sensor parts SP1 and SP2 and the second electrode EL2 may be reduced or solved. Also, in various exemplary embodiments, the thickness H-EC of the middle layer EC is reduced, and thus even when the distance between the first mesh lines MSL1 and the second electrode EL2 is reduced, parasitic capacitor may be prevented from being generated between the first mesh lines MSL1 and the second electrode EL2. Accordingly, various exemplary embodiments further include the black conductive pattern BCP, and thus the thickness of the middle layer EC may be reduced, and a slim electronic device may be achieved.

Hereinafter, with reference to FIGS. 11A to 11G, a exemplary embodiment of a method for manufacturing an electronic device will be described.

Figure 11A:
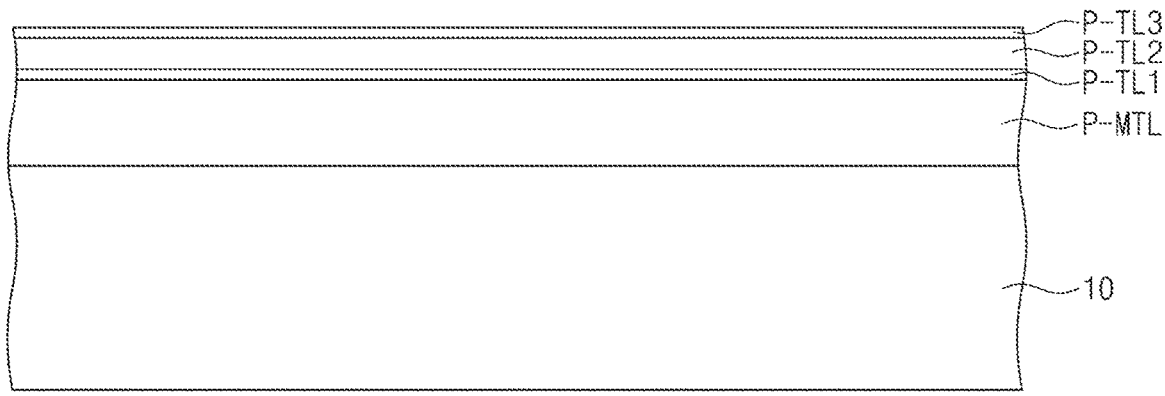
FIGS. 11A to 11G are cross-sectional views illustrating various stages in an exemplary embodiment of a method for manufacturing an electronic device according to the inventive concepts.

As illustrated in FIG. 11A, in various exemplary embodiments, a base conductive layer P-MTL, a lower base layer P-TL1, a middle base layer P-TL2, and a upper base layer P-TL3 which may be sequentially laminated in a third direction DR3 are formed on a base member 10. The base conductive layer P-MTL, the lower base layer P-TL1, the middle base layer P-TL2, and the upper base layer P-TL3 may be formed through a vapor deposition or a coating process.

The base conductive layer P-MTL is formed of a conductive material on the base member 10, and the lower base layer P-TL1 may be formed of a material having an extinction coefficient of about 2.5 or less on the base conductive layer P-MTL. The middle base layer P-TL2 may be formed of a material having a refractive index of about 2.5 or less on the lower base layer P-TL1, and the upper base layer P-TL3 may be formed of a material having an extinction coefficient of about 2.5 or less on the middle base layer P-TL2.

Figure 11B:
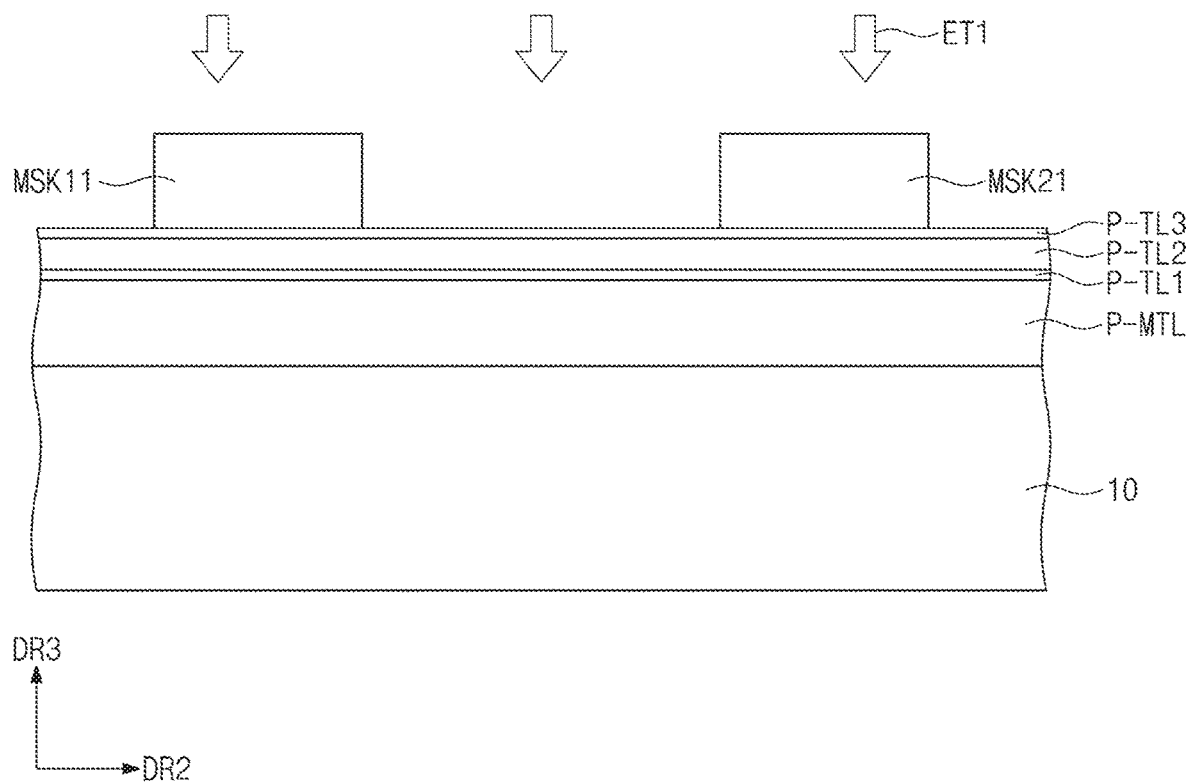
Figure 11C:
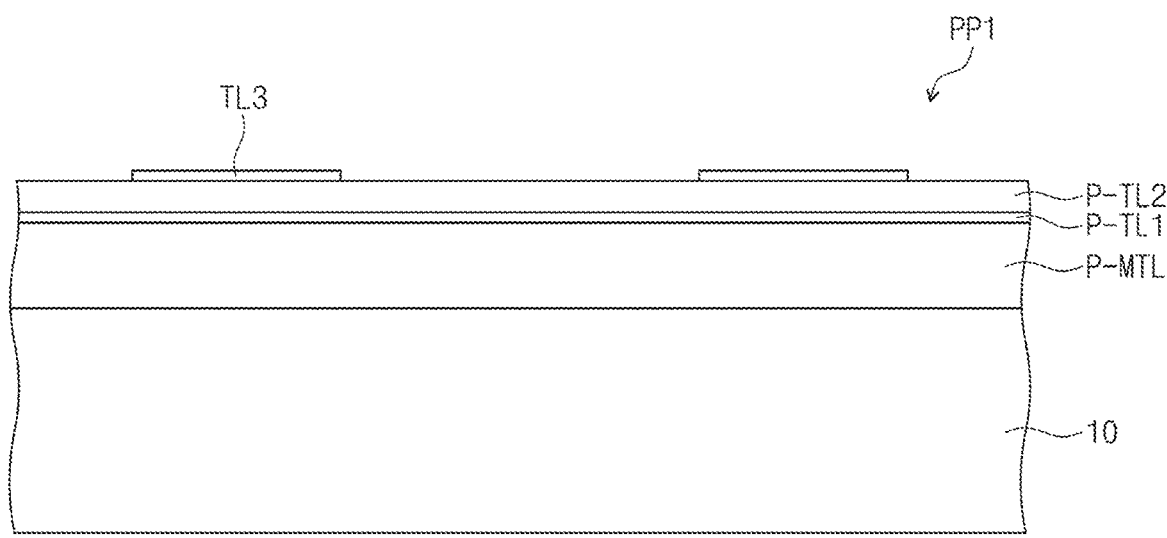

Then, as illustrated in FIGS. 11B and 11C, a first mask MSK11 and a second mask MSK21 are disposed on the upper base layer P-TL3, and the upper base layer P-TL3 may be etched to form a first pattern PP1. Here, the first pattern PP1 may be formed through a dry etching process. Accordingly, a first etchant ET1 may be provided in a gaseous state.

When the upper base layer TL3 is exposed to the first etchant ET1, a region, on which the first mask MSK11 and the second mask MSK21 are not disposed, in the upper base layer P-TL3 may be removed by means of the first etchant ET1 to form the first pattern PP1 including an upper layer TL3.

Figure 11D:
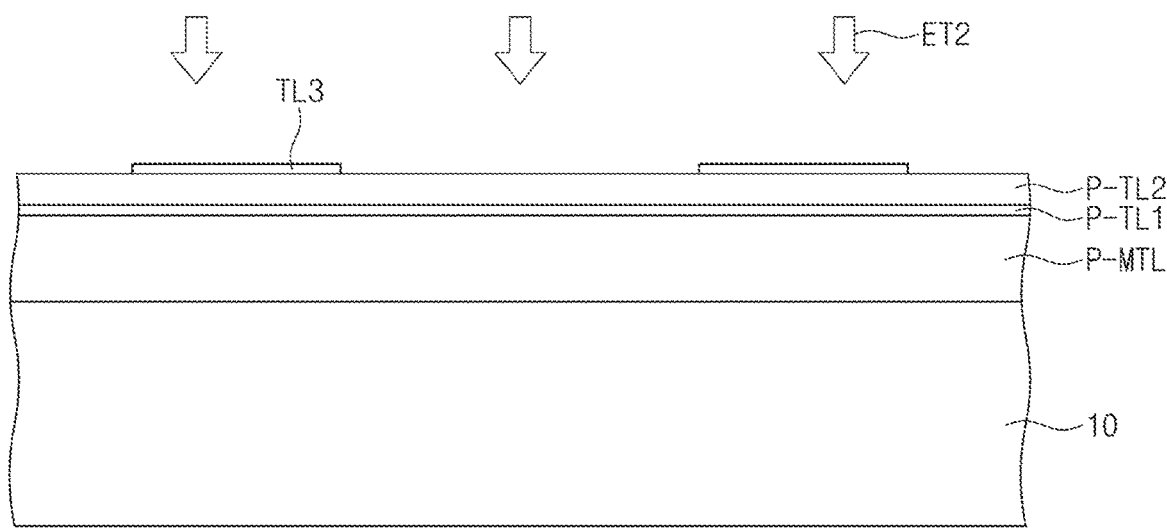
Figure 11E:
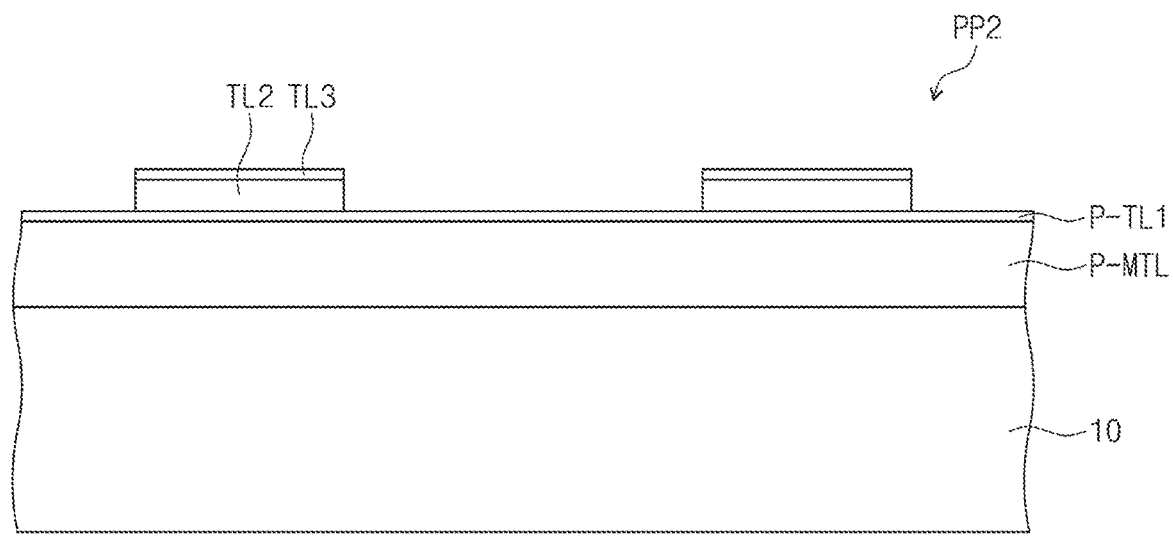
Figure 11E:
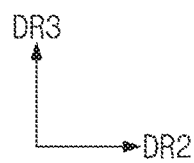

Then, as illustrated in FIGS. 11D and 11E, the basemiddle layer P-TL2 may be etched to form a second pattern PP2. The second pattern PP2 may include an upper layer TL3 and a middle layer TL2.

The second pattern may be formed through a wet etching process. Accordingly, a second etchant ET2 may be provided in a solution state.

In various exemplary embodiments, the middle base layer P-TL2 is etched by exposing the middle base layer P-TL2 to the second etchant ET2. In connection therewith, the first pattern PP1 may function as a mask. Accordingly, the middle base layer P-TL2 and the upper base layer P-TL3 may be formed of a material having great etching selectivity with respect to the second etchant ET2.

Also, the lower base layer P-TL1 may protect the base conductive layer P-MTL from the second etchant ET2 while the second pattern PP2 is formed. Accordingly, the lower base layer P-TL1 and the middle base layer P-TL2 may be selected to be formed of materials having a great etching selectivity with respect to the second etchant ET2.

Figure 11F:
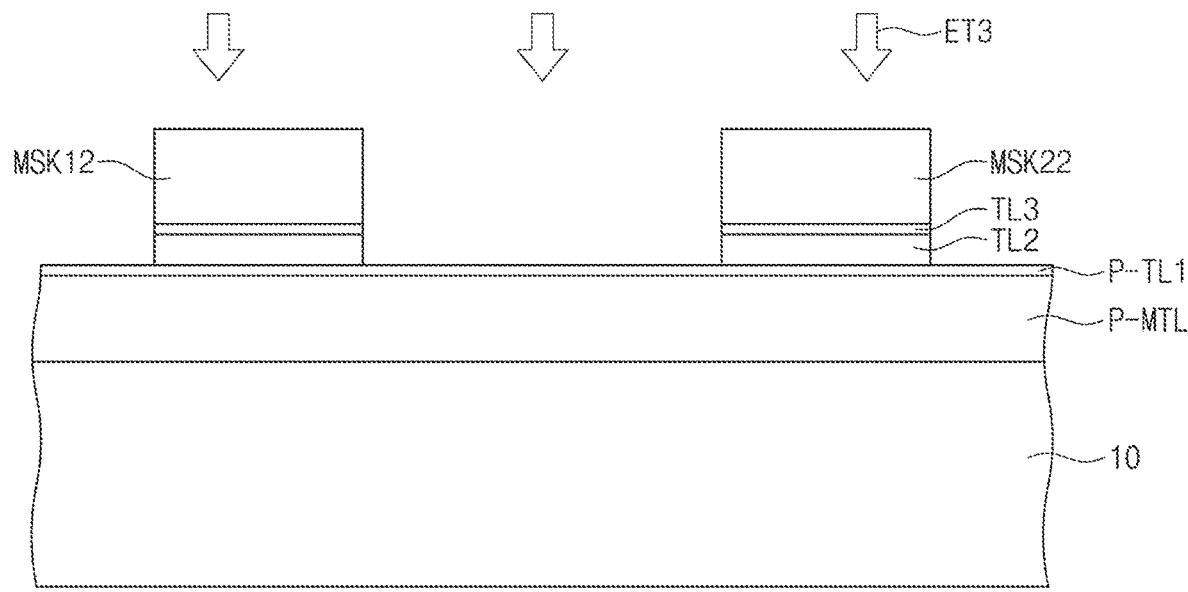
Figure 11F:
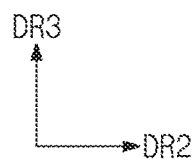
Figure 11G:
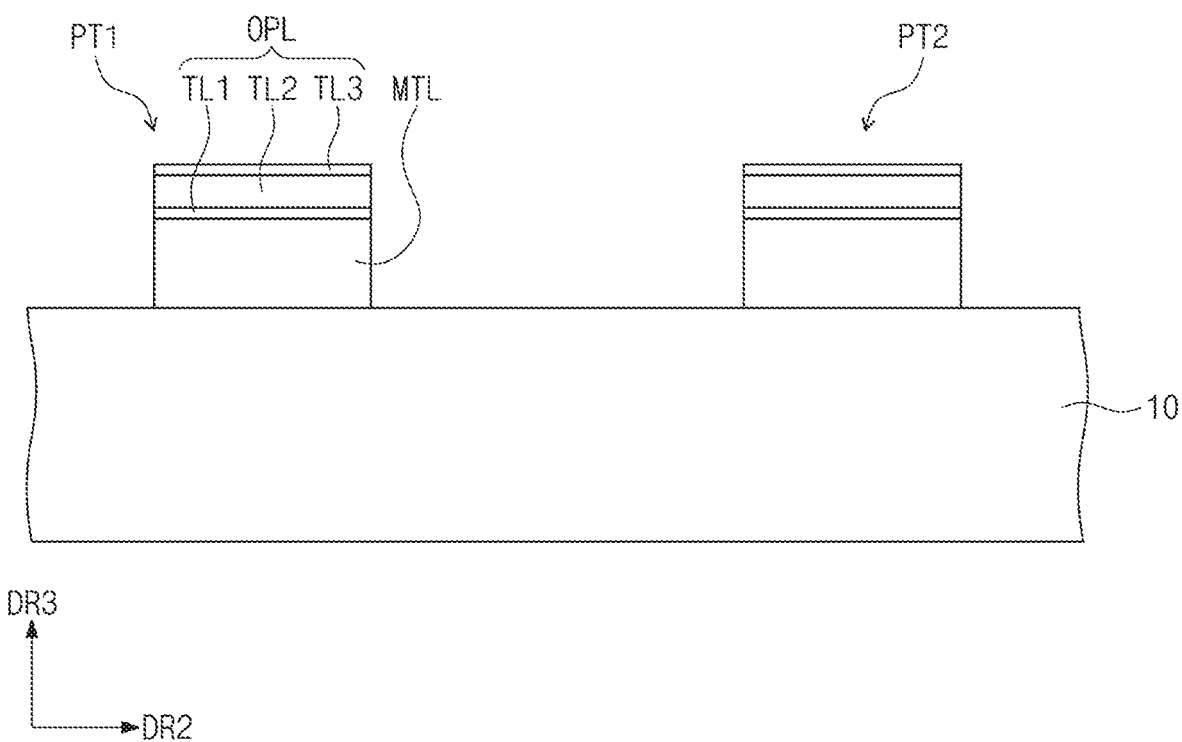

Then, as illustrated in FIGS. 11F and 11G, the lower base layer P-TL1 and the base conductive layer P-MTL are etched to form a lower layer TL1 and a conductive layer MTL. Accordingly, a first conductive pattern PT1 and a second conductive pattern PT2 each of which includes a conductive layer MTL and a darkening layer OPL are formed.

The lower base layer P-TL1 and the base conductive layer P-MTL may be formed through a dry etching process. A third mask MSK12 and a fourth mask MSK22 may be disposed on the second pattern PP2, and a third etchant in a gas state may be provided.

The third and fourth masks MSK12 and MSK22 cover the second pattern PP2. The third and fourth masks MSK12 and MSK22 may have substantially the same shape as the second pattern PP2 when viewed in a plane.

In the lower base layer P-TL1 and the base conductive layer P-MTL, a region on which the third and fourth masks MSK12 and MSK22 are not disposed may be all removed by means of a third etchant ET3. Accordingly, in various exemplary embodiments, the lower layer TL1 and the conductive layer MTL may be formed simultaneously through the same process.

The darkening layer OPL may further include the lower base layer P-TL1 having great etching resistance with respect to the second etchant ET2, and thus the problem of the base conductive layer P-MTL being etched by the second etchant ET2 may be prevented or reduced. The contact of the second etchant ET2 having an isotropic etching mode through the lower base layer P-TL1 with the base conductive layer P-MTL is inhibited, and thus the problem of a portion of the base conductive layer P-MTL being undercut may be prevented or reduced.

According to the foregoing principles of the invention and exemplary embodiments, the problem of reflectivity of external light with respect to a conductive pattern causing the conductive pattern to be viewed by a user may be solved or reduced. Also, in various exemplary embodiments, noise generation between a displayed image and a touch electrode is suppressed and thus a more stable electronic device may be provided.

Also, even when a plurality of etching steps are used to form conductive patterns, in various exemplary embodiments, the structure of the conductive pattern may be stably formed, and thus process yield may be improved.

Although certain exemplary embodiments and implementations have been described herein, other embodiments and modifications will be apparent from this description. Accordingly, the inventive concept is not limited to such embodiments, but rather to the broader scope of the appended claims and various obvious modifications and equivalent arrangements.

What is claimed is:

1. A method for manufacturing a touch panel, the method comprising: sequentially forming, on a base member, a base conductive layer including a metal, a lower base layer including a first conductive material, a middle base layer including a second conductive material, and an upper base layer including a third conductive material; etching the upper base layer to form an upper layer; etching the middle base layer to form a middle layer; and etching the lower base layer and the base conductive layer to form a lower layer and a conductive layer, wherein: the upper layer, the middle layer, the lower layer, and the conductive layer define a first conductive pattern; the first conductive material has an extinction coefficient greater than zero and less than or equal to 2.5; the second conductive material has a refractive index greater than zero and less than or equal to 2.3; and the third conductive material has an extinction coefficient greater than zero and less than or equal to 2.5.

2. The method of claim 1, wherein the etching of the upper base layer is performed by a dry etching process.

3. The method of claim 1, wherein the step of etching the middle base layer is performed by a wet etching process using an etching solution.

4. The method of claim 3, wherein the third conductive material is not etched by the etching solution.

5. The method for manufacturing a touch panel of claim 1, wherein:
   the etching of the lower base layer and the base conductive layer is performed by a single dry etching process; and
   the lower base layer and the base conductive layer are both etched in the single dry etching process.

* * * * *